US009721954B2

(12) United States Patent
Funane

(10) Patent No.: US 9,721,954 B2
(45) Date of Patent: Aug. 1, 2017

(54) STATIC RANDOM ACCESS MEMORY (SRAM) DEVICE

(71) Applicant: Renesas Electronics Corporation, Kawasaki-shi, Kanagawa (JP)

(72) Inventor: Kiyotada Funane, Itami (JP)

(73) Assignee: Renesas Electronics Corporation, Koutou-Ku, Tokyo (JP)

(*) Notice: Subject to any disclaimer, the term of this patent is extended or adjusted under 35 U.S.C. 154(b) by 0 days.

(21) Appl. No.: 15/251,504

(22) Filed: Aug. 30, 2016

(65) Prior Publication Data

US 2016/0372477 A1    Dec. 22, 2016

Related U.S. Application Data

(60) Division of application No. 14/918,788, filed on Oct. 21, 2015, now Pat. No. 9,455,225, which is a division
(Continued)

(30) Foreign Application Priority Data

Feb. 23, 2012    (JP) .................................. 2012-037968

(51) Int. Cl.
*H01L 23/522* (2006.01)
*H01L 27/11* (2006.01)
(Continued)

(52) U.S. Cl.
CPC .............. *H01L 27/11* (2013.01); *G11C 5/063* (2013.01); *G11C 5/14* (2013.01); *G11C 11/417* (2013.01); *G11C 11/418* (2013.01); *G11C 11/419* (2013.01); *H01L 23/481* (2013.01); *H01L 23/5226* (2013.01); *H01L 23/5283* (2013.01); *H01L 23/5286* (2013.01); *H01L 27/1104* (2013.01); *H01L 27/1116* (2013.01); *H01L 23/528* (2013.01); *H01L 27/0207* (2013.01); *H01L 2924/0002* (2013.01)

(58) Field of Classification Search
CPC .. H01L 23/522; H01L 23/528; H01L 23/5221
See application file for complete search history.

(56) References Cited

U.S. PATENT DOCUMENTS 6,175,132 B1 *    1/2001    Sato ................. H01L 27/10897
                                                                257/296
6,800,814 B2    10/2004    Ohsaka
(Continued)

FOREIGN PATENT DOCUMENTS

JP    3-196631 A    8/1991
JP    8-213470 A    8/1996
(Continued)

OTHER PUBLICATIONS

Communication dated Mar. 16, 2015 from the Japanese Patent Office in counterpart Application No. 2012-037968.

*Primary Examiner* — Phuc Dang
(74) *Attorney, Agent, or Firm* — Sughrue Mion, PLLC

(57) ABSTRACT

To reinforce power supply wirings without sacrificing the interconnectivity of semiconductor devices. When three wirings are formed in parallel in the same wiring layer and the center wiring among them is shorter than the outer wirings, a projecting portion integrated into the outer wiring is formed utilizing a free space remaining on the extension of the center wiring. For example, when the outer wirings are used as power supply wirings, the power supply wirings can be reinforced by adding the projecting portion. At this time, because the projecting portion is arranged in the free space, the interconnectivity is not sacrificed.

13 Claims, 27 Drawing Sheets

Related U.S. Application Data of application No. 14/471,278, filed on Aug. 28, 2014, now Pat. No. 9,196,570, and a continuation of application No. 13/774,453, filed on Feb. 22, 2013, now Pat. No. 8,847,402.

(51) Int. Cl.

| | | |
|---|---|---|
| *H01L 23/48* | (2006.01) | |
| *G11C 5/06* | (2006.01) | |
| *G11C 5/14* | (2006.01) | |
| *G11C 11/417* | (2006.01) | |
| *G11C 11/418* | (2006.01) | |
| *G11C 11/419* | (2006.01) | |
| *H01L 27/02* | (2006.01) | |
| *H01L 23/528* | (2006.01) | |

(56) References Cited

U.S. PATENT DOCUMENTS

| | | |
|---|---|---|
| 7,875,982 B2 | 1/2011 | Abe |
| 8,362,616 B2 | 1/2013 | Yasumori et al. |
| 8,847,402 B2 | 9/2014 | Funane |
| 9,196,570 B2 | 11/2015 | Funane |
| 2007/0290361 A1 | 12/2007 | Chen |
| 2009/0223046 A1 | 9/2009 | Murayama et al. |
| 2010/0118581 A1 | 5/2010 | Okayama |
| 2010/0237346 A1* | 9/2010 | Kanno ............... G11C 13/0007 257/49 |
| 2010/0327459 A1* | 12/2010 | Yasumori ............. H01L 23/522 257/776 |
| 2011/0006439 A1 | 1/2011 | Ichiryu et al. |
| 2011/0134683 A1* | 6/2011 | Yamazaki ............ G11C 11/405 365/149 |
| 2012/0126422 A1* | 5/2012 | Endo ................. H01L 23/5286 257/774 |

FOREIGN PATENT DOCUMENTS

| | | |
|---|---|---|
| JP | 2001-36049 A | 7/1999 |
| JP | 2000-156416 A | 6/2000 |
| JP | 2007-5535 A | 1/2007 |
| JP | 2007-294629 A | 11/2007 |
| JP | 2008-227130 A | 9/2008 |
| JP | 2009-49034 A | 3/2009 |
| JP | 2011-14637 A | 1/2011 |

* cited by examiner

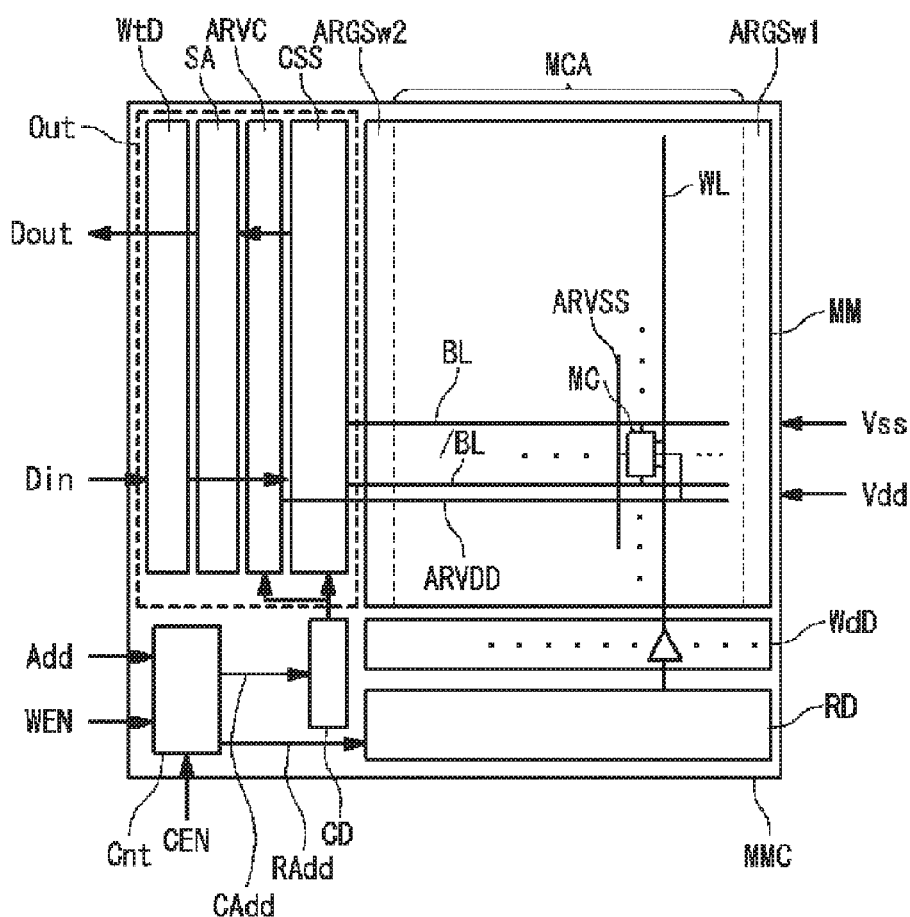

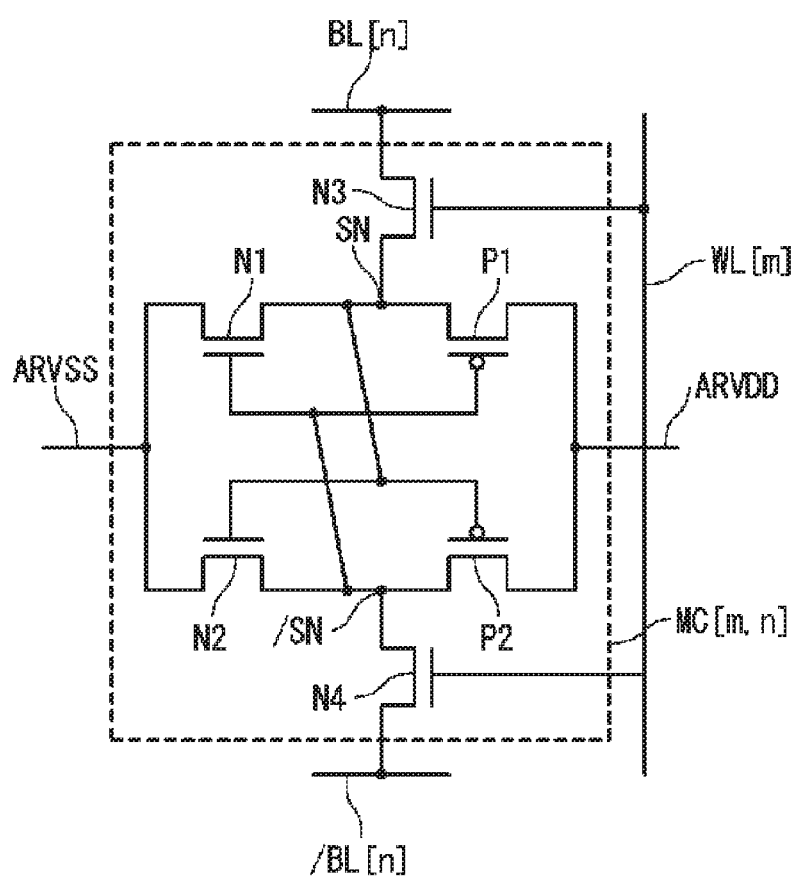

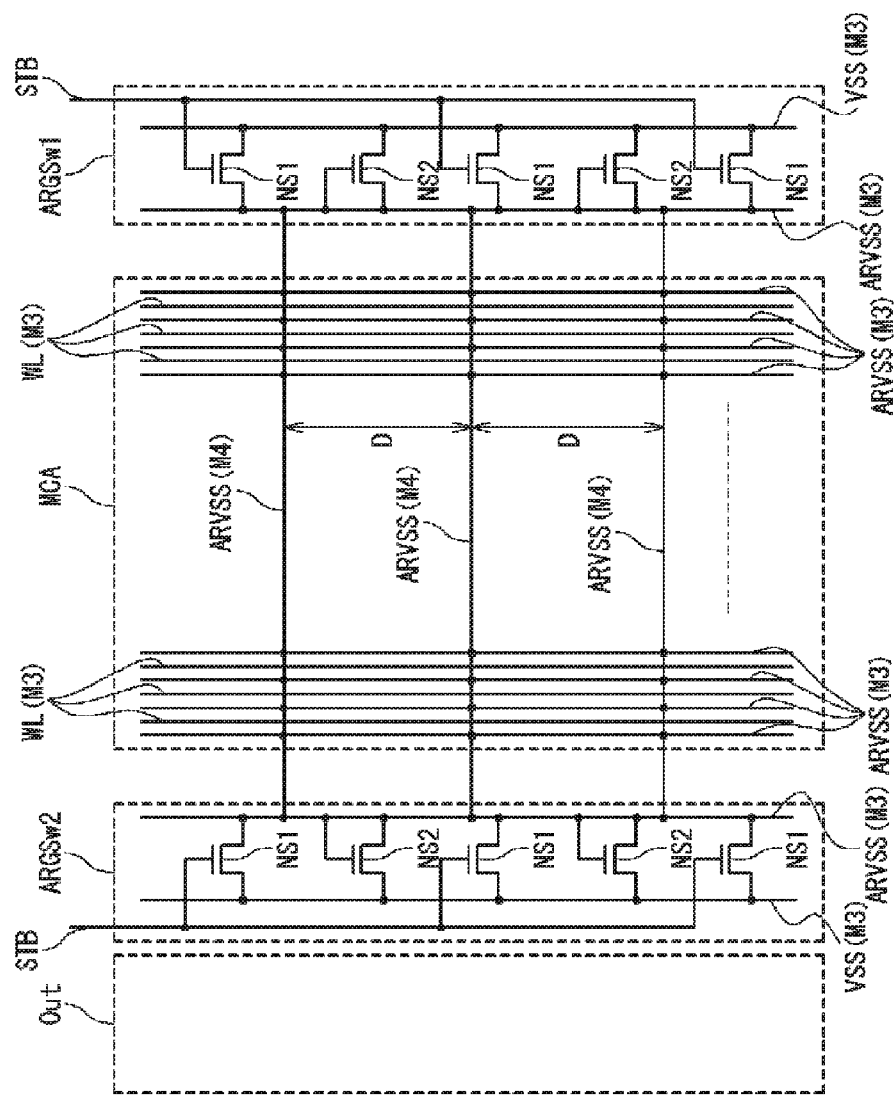

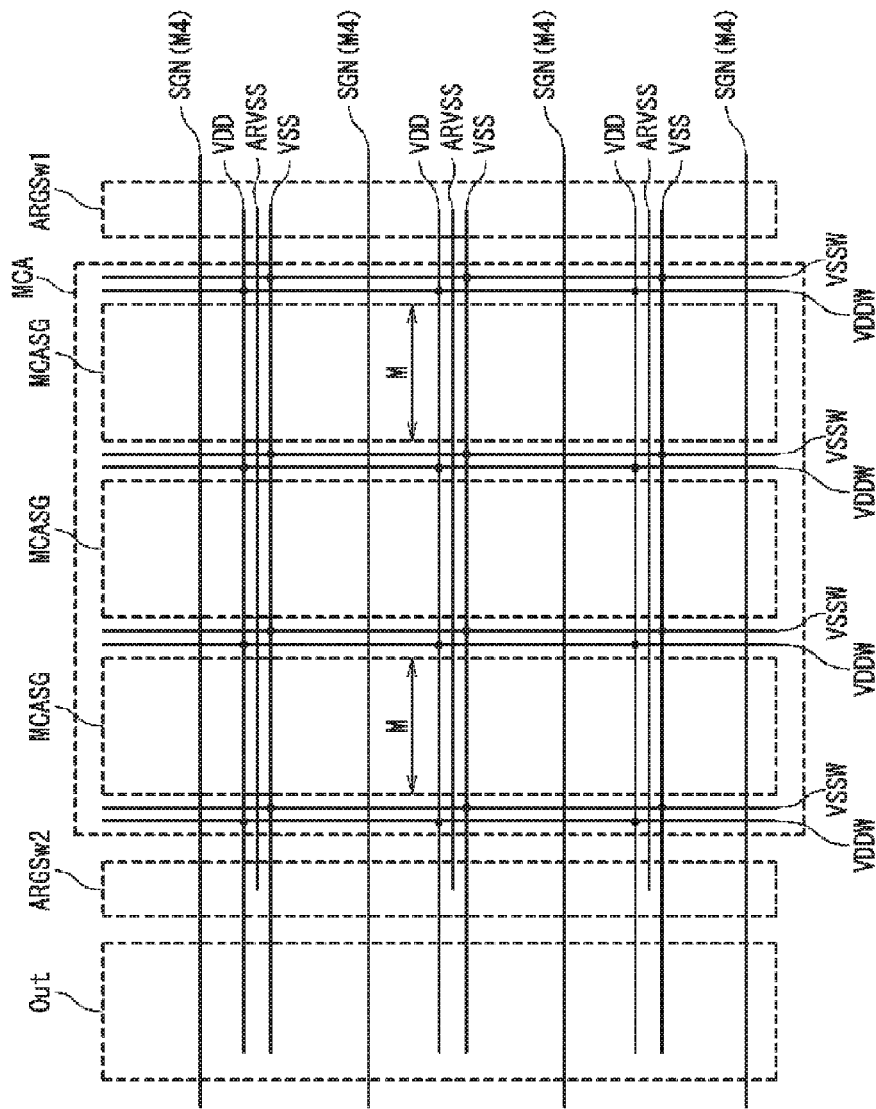

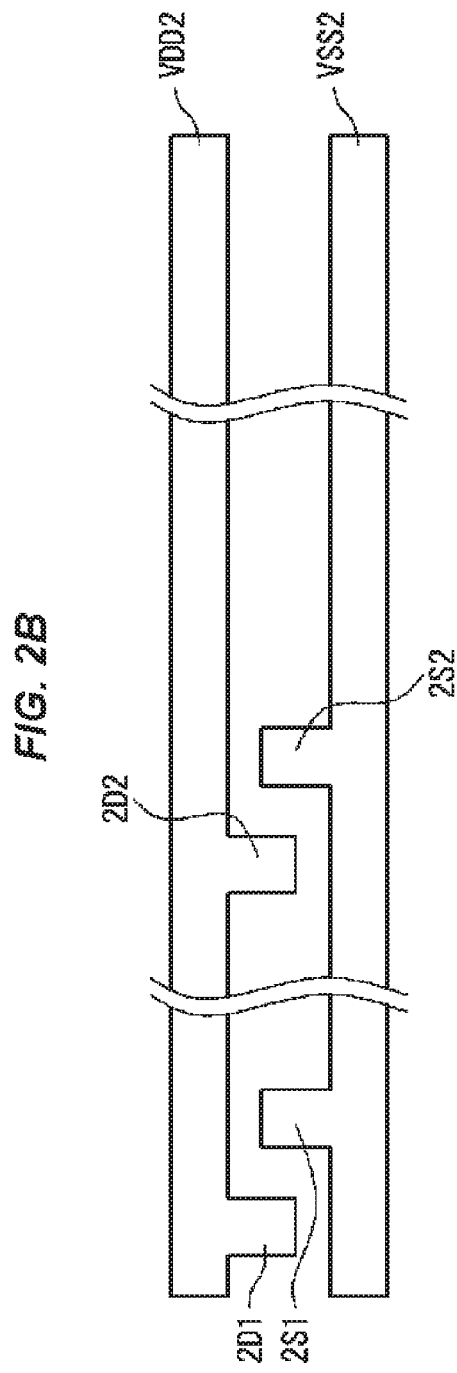

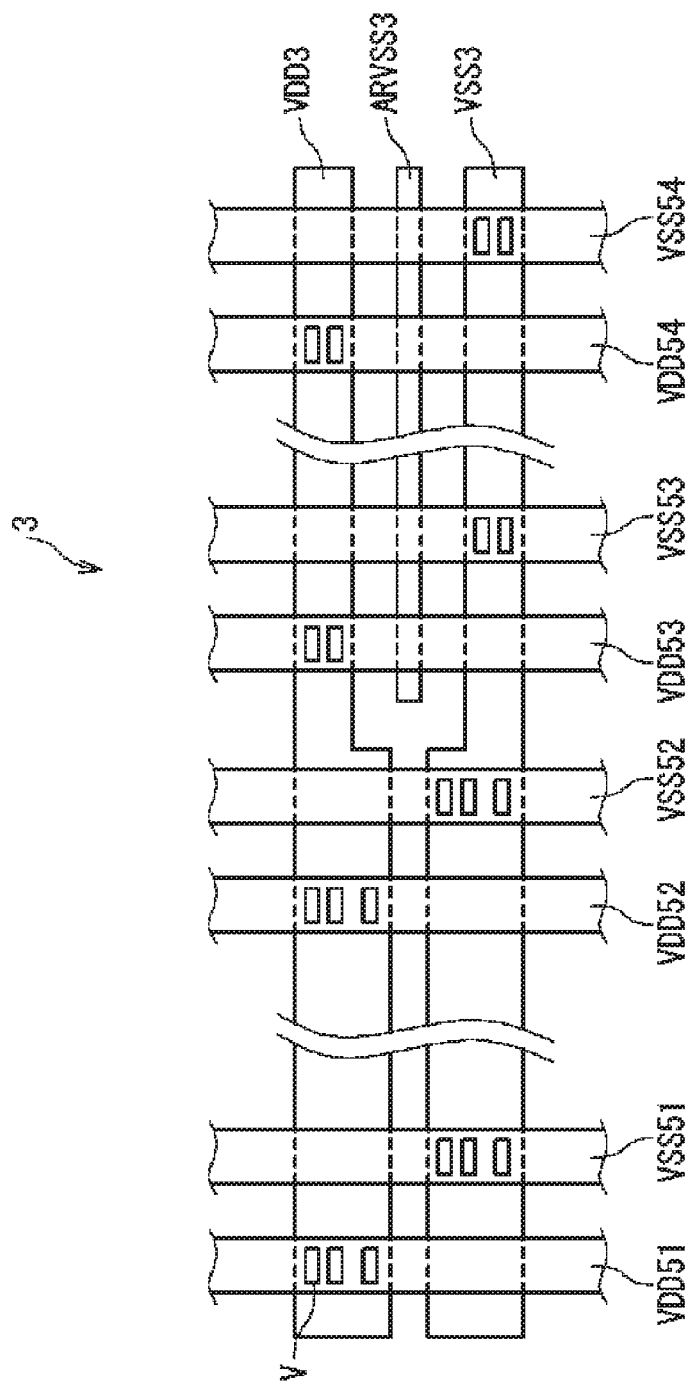

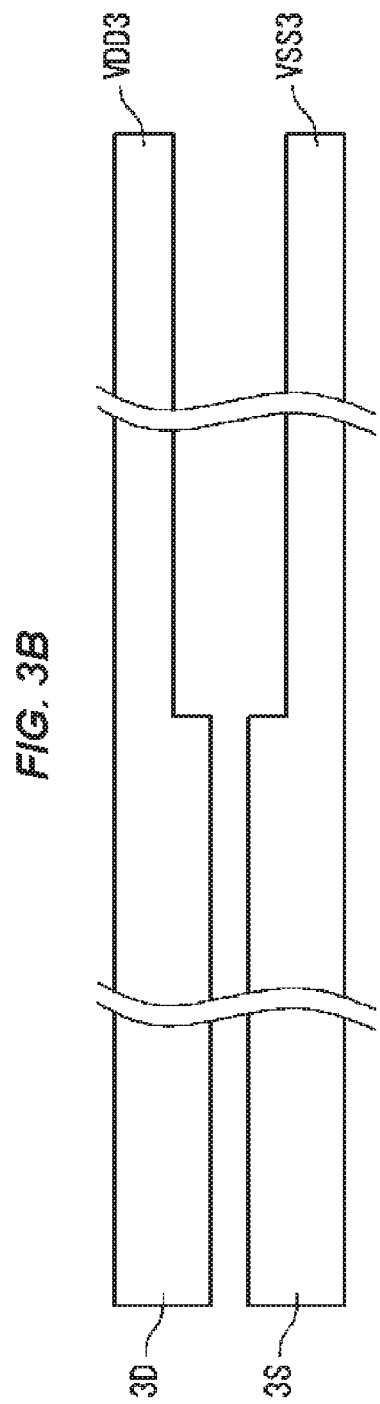

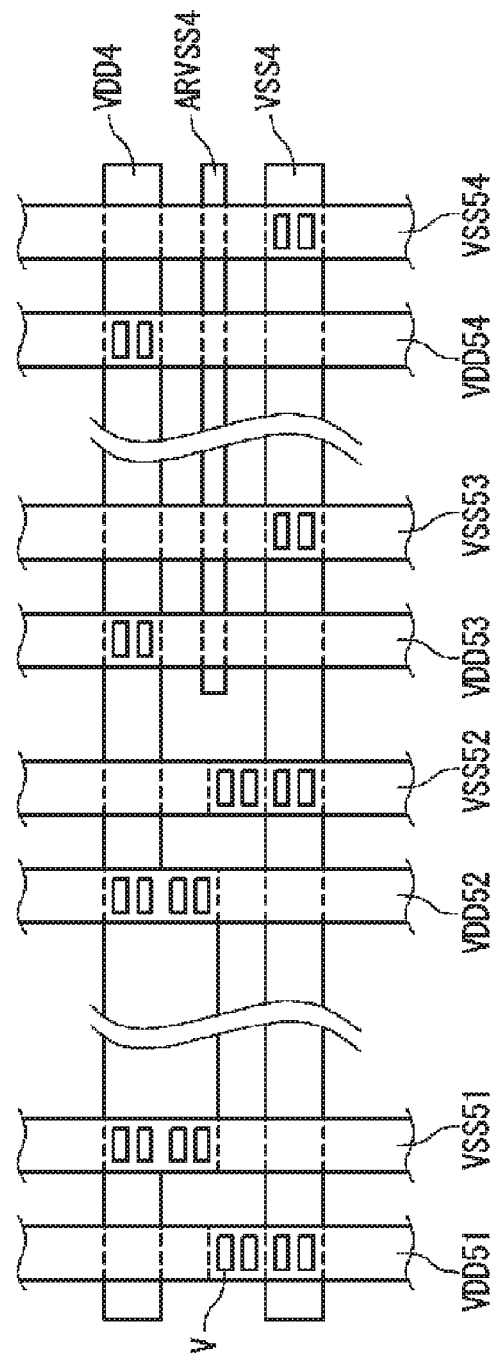

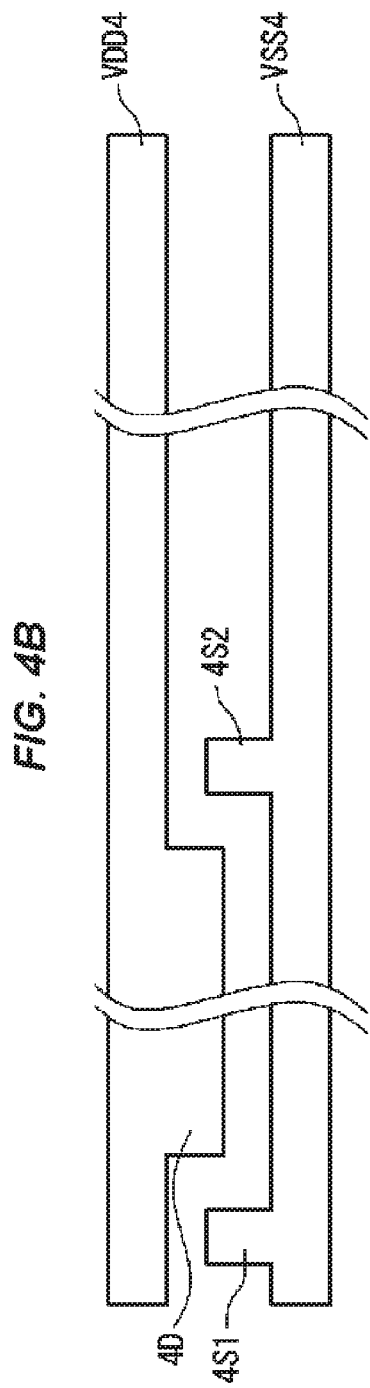

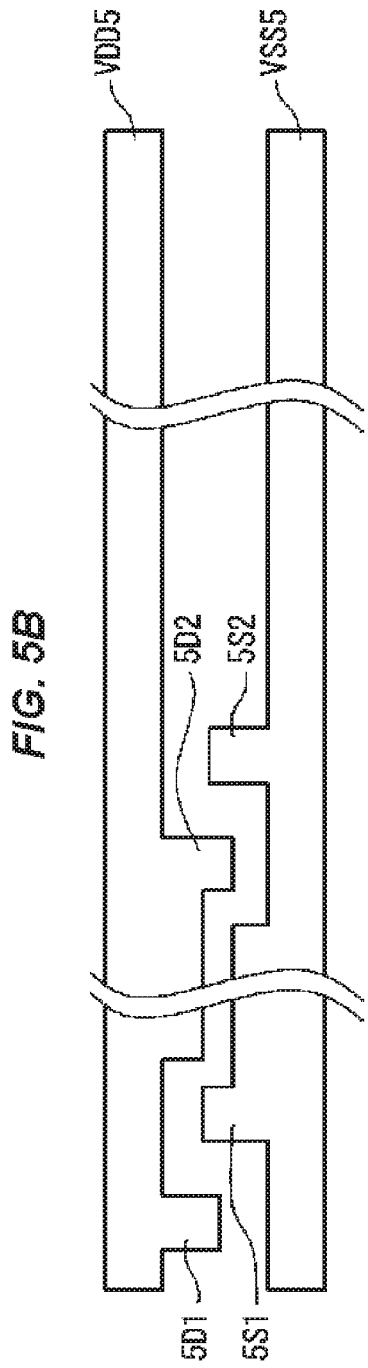

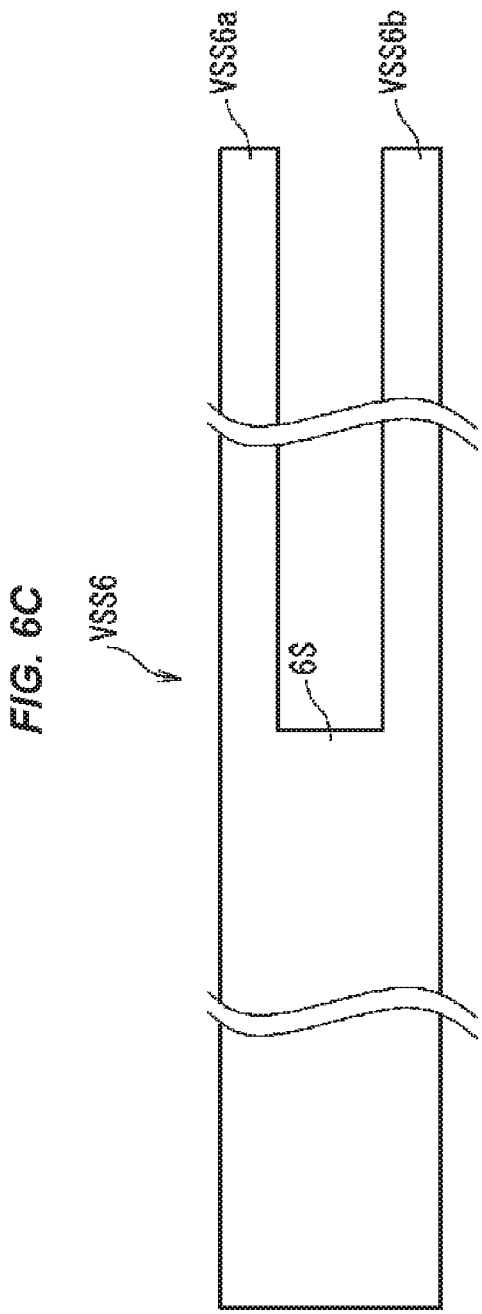

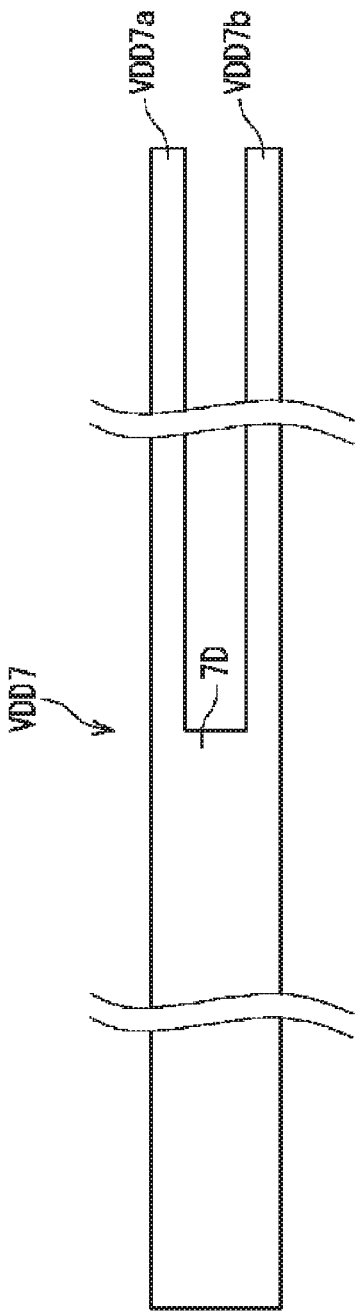

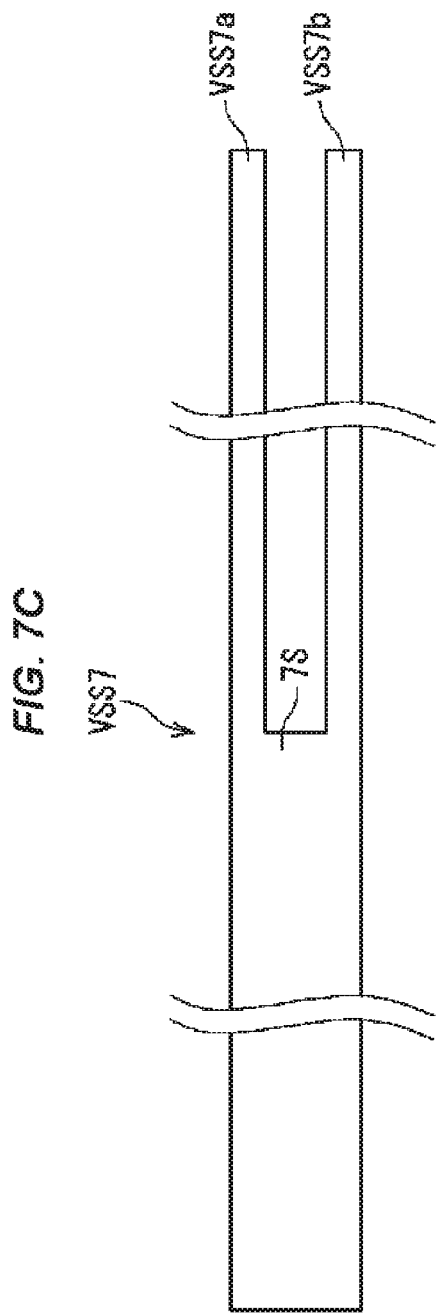

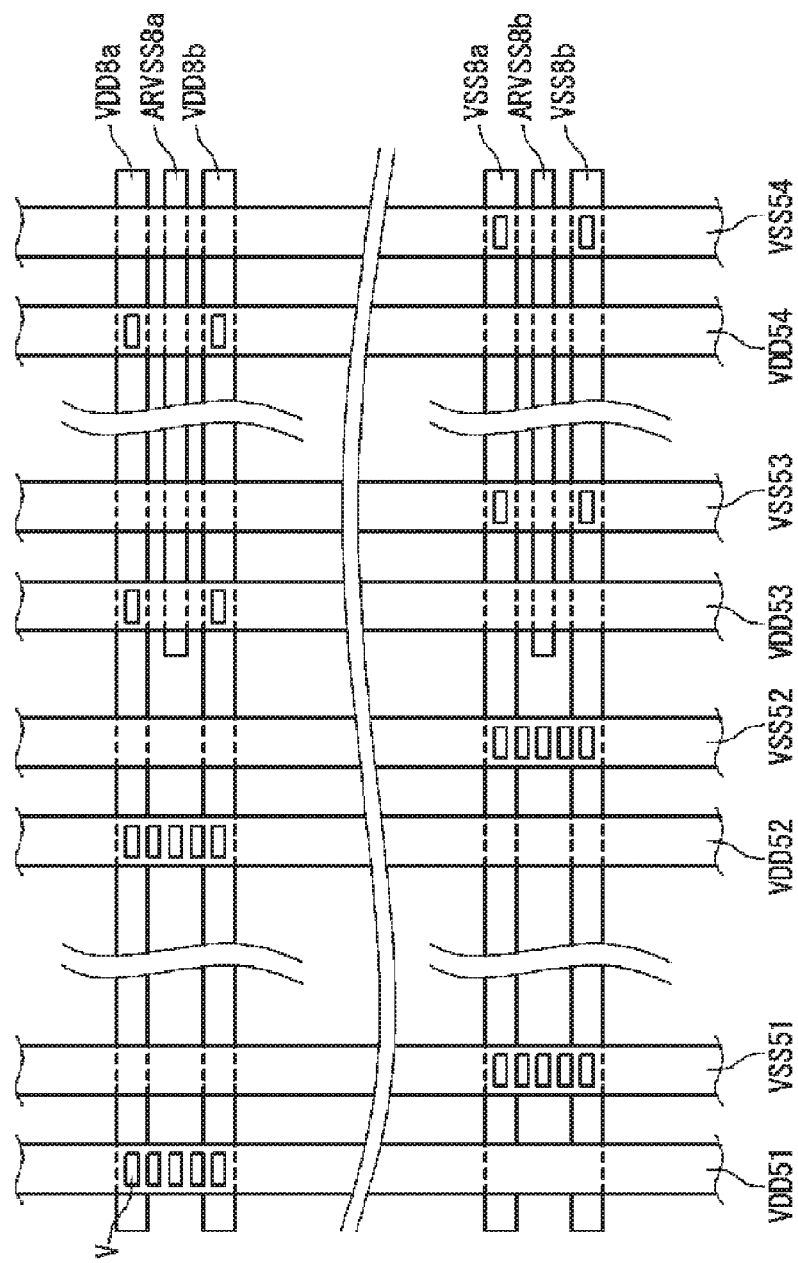

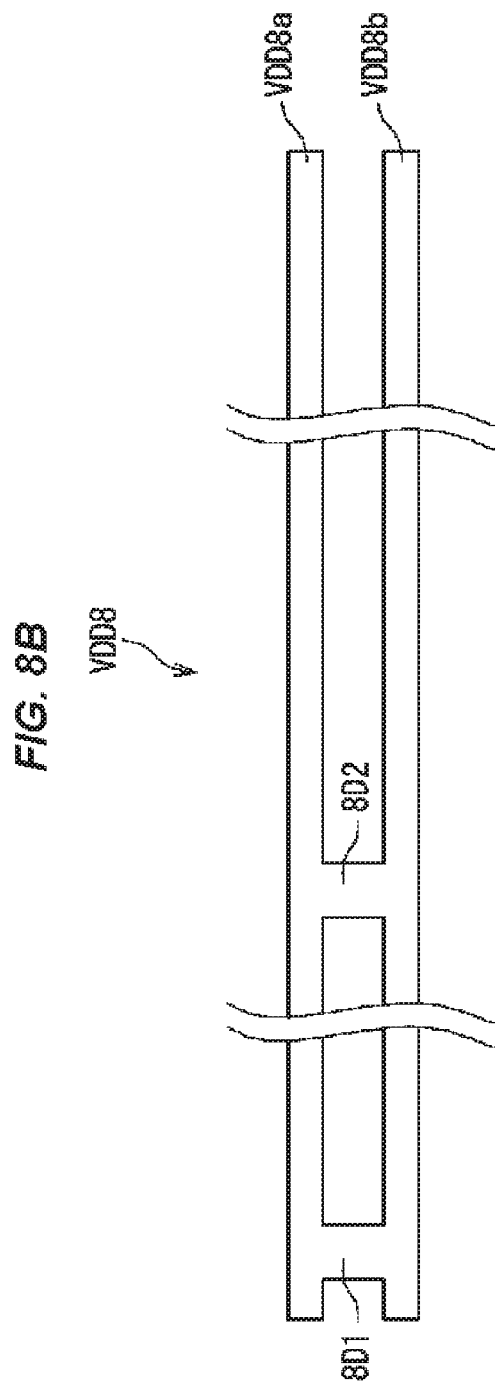

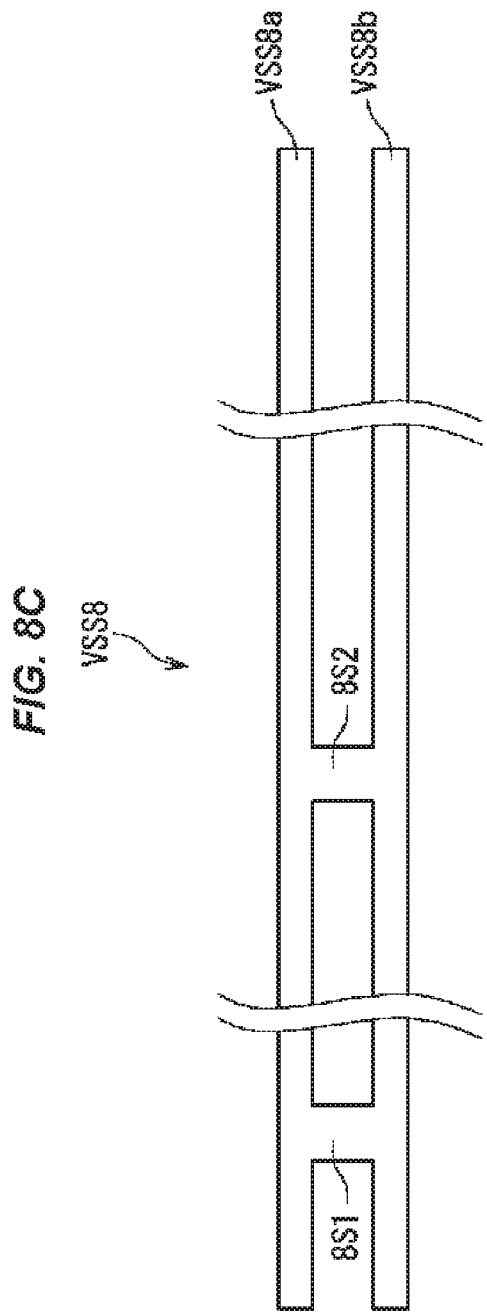

STATIC RANDOM ACCESS MEMORY (SRAM) DEVICE

CROSS-REFERENCE TO RELATED APPLICATIONS

This application is a divisional application based upon U.S. patent application Ser. No. 14/918,788, filed Oct. 21, 2015, now U.S. Pat. No. 9,455,225, patented on Sep. 27, 2016, which is a Divisional of U.S. patent application Ser. No. 14/471,278, filed on Aug. 28, 2014, now U.S. Pat. No. 9,196,570, patented on Nov. 24, 2015, which is a Continuation Application of U.S. application Ser. No. 13/774,453, filed Feb. 22, 2013, now U.S. Pat. No. 8,847,402, patented on Sep. 30, 2014, which claims the benefit of priority from Japanese Patent Application No. 2012-037968 filed on Feb. 23, 2012, the disclosures of which are incorporated herein in their entirety by reference.

BACKGROUND

The present invention relates to semiconductor devices, and can be suitably used for the semiconductor devices incorporating an SRAM (Static Random Access Memory), for example.

As miniaturization of semiconductor devices proceeds, it is becoming more difficult to meet the criteria of a drop of a power supply voltage, power EM (ElectroMigration), and the like. As the countermeasure therefor, adding power supply terminals and/or adding power supply vias are known, but in either case, the interconnectivity might be degraded.

In connection with the above description, Patent Document 1 (Japanese Patent Laid-Open No. 2001-36049) discloses a description of a semiconductor memory device. This semiconductor memory device includes a plurality of MIS transistors, a main bit line, a sub bit line, a first switching element, a first source line, a second source line, and a word line. Here, the MIS transistors each have a floating gate, a control gate, a source, and a drain. The sub bit line is provided for each set formed for every multiple MIS transistors of a plurality of MIS transistors. The first switching element selectively couples the sub bit line to the main bit line. The first source line is coupled in common to the sources of the multiple MIS transistors in a plurality of sets. The second source line is coupled in common to the sources of the multiple MIS transistors in each of the sets, to which the first source line is not coupled. The word line couples one control gate of multiple MIS transistors in one set to one control gate of multiple MIS transistors in other set. The word line coupled to the control gate of the MIS transistors each having the source, to which the first source line is coupled, includes a first wiring and a second wiring. Here, the first wiring includes a first nonmetallic electric conductor. The second wiring includes metal, and is disposed in a layer different from that of the first wiring and is coupled to the first wiring. The word line coupled to the control gate of multiple MIS transistors each having the source, to which the second source line is coupled, includes a first layer wiring. The first source line and the sub bit line include a second nonmetallic electric conductor. The second source line includes metal.

Moreover, Patent Document 2 (Japanese Patent Laid-Open No. 2008-227130) discloses a description of a semiconductor integrated circuit. A plurality of standard cells is arranged in this semiconductor integrated circuit. This semiconductor integrated circuit includes a first cell power supply wiring, a second cell power supply wiring, a first upper-layer power supply wiring, and a second upper-layer power supply wiring. Here, the first cell power supply wiring extends in one direction, and supplies current to the standard cells. The second cell power supply wiring is wired in parallel to the first cell power supply wiring, and supplies current to the standard cells. The first upper-layer power supply wiring is wired perpendicularly to the first and second cell power supply wirings, in an upper layer of the first and second cell power supply wirings, and is coupled to the first cell power supply wiring through a via. The second upper-layer power supply wiring is wired perpendicularly to the first and second cell power supply wirings, in an upper layer of the first and second cell power supply wirings, and is coupled to the second cell power supply wiring through a via. In a region overlapping with the first upper-layer power supply wiring and including a portion, in which a via coupling the first cell power supply wiring and the first upper-layer power supply wiring is disposed, the first cell power supply wiring includes a first wide portion with a width wider than the width of a region not overlapping with the first and second upper-layer power supply wirings.

Furthermore, Patent Document 3 (Japanese Patent Laid-Open No. 2009-49034) discloses a description of a semiconductor device. This semiconductor device includes an interlayer insulating film, a lower wiring layer, an upper wiring layer, and a via hole. Here, the lower wiring layer is disposed on the lower side of the interlayer insulating film. The upper wiring layer is disposed on the upper side of the interlayer insulating film. The via hole extends through the interlayer insulating film, and electrically couples a wiring belonging to the lower wiring layer and a wiring belonging to the upper wiring layer. This semiconductor device has the following features. That is, a plurality of wiring lines and a contact region are provided. Here, the wiring lines extend along a predetermined direction in the lower wiring layer. The contact region is formed by partially coupling at least two wiring lines, and contacts with a via hole. Moreover, in the wiring lines, a void is present in a first interlayer insulating film located between wiring lines adjacent to each other. In a second interlayer insulating film located between a contact portion of the via hole in the contact region and a wiring line adjacent to the contact region, a void is not present.

Moreover, Patent Document 4 (Japanese Patent Laid-Open No. 2011-14637) discloses a description of a semiconductor device. This semiconductor device includes first and second wirings, third and fourth wirings, a fifth wiring, a first contact conductor, and a second contact conductor. Here, the first and second wirings are provided in a first wiring layer and extend in parallel in a first direction. The third and fourth wirings are provided in a second wiring layer and extend in parallel in a second direction intersecting the first direction. The fifth wiring is provided in a third wiring layer located between the first wiring layer and the second wiring layer. The first contact conductor couples the first wiring and the third wiring. The second contact conductor couples the second wiring and the fourth wiring. Moreover, the first and second contact conductors are arranged in the first direction.

SUMMARY

The present invention has been made in view of the above circumstances and provides semiconductor devices, in which power supply wirings are reinforced without sacrificing the interconnectivity of the semiconductor devices.

The other purposes and the new feature of the present invention will become clear from the description of the present specification and the accompanying drawings.

Hereinafter, a measure for solving the above-described problems is described using reference numerals to be used in "DETAILED DESCRIPTION". These reference numerals are attached to clarify a correspondence between the description of the claims and "DETAILED DESCRIPTION". However, these reference numerals shall not be used for interpretation of the technical scope of the inventions described in the claims.

According to an embodiment, when three wirings (VDD2, VSS2, ARVSS2) are formed in parallel in the same wiring layer and the center wiring (ARVSS2) among them is shorter than the outer wirings (VDD2, VSS2), projecting portions (2D1, 2D2, 2S1, 2S2) integrated into the outer wirings (VDD2, VSS2) are formed utilizing a free space (VS2) remaining over the extension line of the center wiring (ARVSS2).

According to the embodiment, for example, when the outer wirings are used as power supply wirings, the power supply wirings can be reinforced by adding the projecting portions. At this time, because the projecting portions are disposed in the free space, the interconnectivity is not sacrificed.

BRIEF DESCRIPTION OF THE DRAWINGS

FIG. 1A is a plan block circuit diagram schematically showing the overall configuration of a typical SRAM;

FIG. 1B is a circuit diagram showing the detailed configuration of a memory cell included in a memory cell array shown in FIG. 1A;

FIG. 1H is a block circuit diagram schematically showing the configuration of wirings related to a local ground line of a memory cell array in a typical SRAM;

FIG. 1I is a block circuit diagram schematically showing the configuration of wirings related to an external power supply voltage line and an external ground voltage line VSS of the memory cell array in a typical SRAM;

FIG. 2B is a plan view showing the configuration of an external power supply voltage line VDD2 and an external ground voltage line VSS2 according to the first embodiment;

FIG. 3A is a plan view showing the configuration of a wiring portion 3 according to a second embodiment;

FIG. 3B is a plan view showing the configuration of an external power supply voltage line VDD3 and an external ground voltage line VSS3 according to the second embodiment;

FIG. 4A is a plan view showing the configuration of a wiring portion 4 according to a third embodiment;

FIG. 4B is a plan view showing the configuration of an external power supply voltage line VDD4 and an external ground voltage line VSS4 according to the third embodiment;

FIG. 5B is a plan view showing the configuration of an external power supply voltage line VDD5 and an external ground voltage line VSS5 according to the fourth embodiment;

FIG. 6C is a plan view showing the configuration of external ground voltage lines VSS6*a* and VSS6*b* according to the fifth embodiment;

FIG. 7B is a plan view showing the configuration of external power supply voltage lines VDD7*a* and VDD7*b* according to the sixth embodiment;

FIG. 7C is a plan view showing the configuration of external ground voltage lines VSS7*a* and VSS7*b* according to the sixth embodiment;

FIG. 8A is a plan view showing the configuration of a wiring portion 8 according to a seventh embodiment;

FIG. 8B is a plan view showing the configuration of external power supply voltage lines VDD8*a* and VDD8*b* according to the seventh embodiment; and FIG. 8C is a plan view showing the configuration of external ground voltage lines VSS8*a* and VSS8*b* according to the seventh embodiment.

DETAILED DESCRIPTION

Figure 1C:
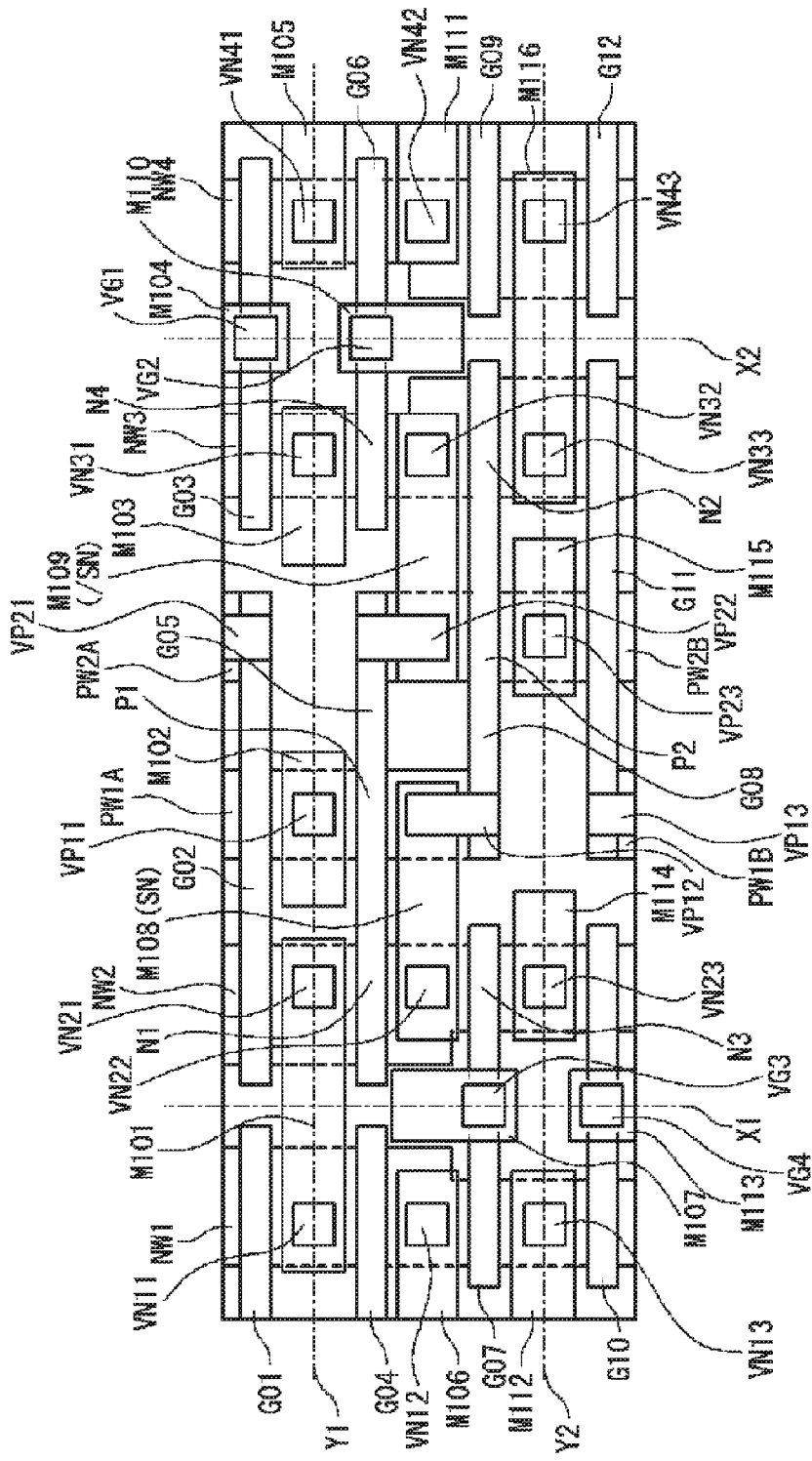
FIG. 1C is a plan view extracting and showing a semiconductor substrate and a first wiring layer of the memory cell shown in FIG. 1B and its peripheral region.

With reference to the accompanying drawings, forms for implementing semiconductor devices according to the present invention are described hereinafter.

First Embodiment

FIG. 1A is a plan block circuit diagram schematically showing the overall configuration of a typical SRAM. The configuration of the SRAM shown in FIG. 1A is described. This SRAM includes a memory mat circuit MM, an output circuit Out, a word driver circuit WdD, a row decoder RD, a control circuit Cnt, a column decoder CD, a word line WL, a first bit line BL and a second bit line /BL constituting a bit line pair, a cell power supply line ARVDD, and a local ground line ARVSS. Here, the bit line pair BL and /BL, the cell power supply line ARVDD, and the local ground line ARVSS are preferably provided in plural numbers, respectively.

The memory mat circuit MM includes a memory cell array MCA, a first ground line switch circuit ARGSw1, and a second ground line switch circuit ARGSw2. The memory cell array MCA includes a plurality of memory cells MC arranged in a vertical and horizontal array.

The output circuit Out includes a column selection switch circuit CSS, a cell power-supply voltage line control circuit ARVC, a sense amplifier circuit SA, and a write driver circuit WtD.

A connection relation between the components of the SRAM shown in FIG. 1A is described. The cell power-supply voltage line control circuit ARVC and the memory cell MC are coupled to each other via the cell power supply line ARVDD. Here, a plurality of memory cells MC horizontally arranged in FIG. 1A is preferably coupled to the same cell power supply line ARVDD. Moreover, a plurality of memory cells MC vertically arranged in FIG. 1A is preferably grounded via the same local ground line ARVSS.

The column selection switch circuit CSS and the memory cell MC are coupled to each other via the bit line pair BL and /BL. Here, preferably, the memory cells MC horizontally arranged in FIG. 1A are coupled to each other via the same first bit line BL and also coupled to each other via the same second bit line /BL.

The word driver circuit WdD and the memory cell MC are coupled to each other via the word line WL. Here, the memory cells MC vertically arranged in FIG. 1A are preferably coupled to the same word line WL.

The operation of the SRAM shown in FIG. 1A is described. The control circuit Cnt receives a chip enable signal CEN, a write enable signal WEN, and an address signal Add. When the chip enable signal CEN indicates an inactive state, the control circuit Cnt is turned off. When the chip enable signal CEN indicates an active state, the control circuit Cnt is turned on and a read operation and a write operation of the SRAM are carried out.

When the write enable signal WEN indicates "data write", the control circuit Cnt activates the write driver circuit WtD. The write driver circuit WtD is activated during the write operation and transfers an input data signal Din to the column selection switch circuit CSS. The write driver circuit WtD becomes inactive except during the write operation.

When the write enable signal WEN indicates "data read", the control circuit Cnt activates the sense amplifier circuit SA. The sense amplifier circuit SA is activated during the read operation, and amplifies a weak read-out data signal transferred from the column selection switch circuit CSS to generate an output data signal Dout. The sense amplifier circuit SA becomes inactive except during the read operation.

The control circuit Cnt generates a row address RAdd and a column address CAdd based on the address signal Add.

The row decoder RD receives and decodes the row address RAdd, and controls the word driver circuit WdD based on the decoded result. The word driver circuit WdD includes a plurality of word drivers corresponding to each of a plurality of rows. A word driver corresponding to a row which the decoded result of the row address RAdd indicates is activated to drive the corresponding word line WL.

The column decoder CD receives and decodes the column address CAdd, and controls the column selection switch circuit CSS and the cell power-supply voltage line control circuit ARVC based on the decoded result.

The column selection switch circuit CSS selects a bit line pair BL and /BL corresponding to the column address CAdd among a plurality of bit line pairs BL and /BL corresponding to a plurality of rows, respectively. The selected bit line pair BL and /BL are coupled to the sense amplifier circuit SA during the read operation, and are coupled to the write driver circuit WtD during the write operation. Note that, the selected bit line pair BL and /BL are charged to a level of the external power supply voltage Vdd by a non-illustrated bit line precharge circuit before the read operation or write operation is executed.

The cell power-supply voltage line control circuit ARVC controls, for each column, the voltage level of the cell power supply line ARVDD provided for each column. During the write operation, the cell power-supply voltage line control circuit ARVC decreases the voltage of the cell power supply line ARVDD of a selected column from the level of the external power supply voltage Vdd, but maintains the voltage of the cell power supply line ARVDD of the other columns at the level of the external power supply voltage Vdd. Moreover, during the read operation and during standby, the cell power-supply voltage line control circuit ARVC maintains the voltage of all the cell power supply lines ARVDD at the level of the external power supply voltage Vdd.

FIG. 1B is a circuit diagram showing the detailed configuration of a memory cell MC [m, n] included in the memory cell array MCA shown in FIG. 1A. Here, array numbers m and n indicate the column and row in the memory cell array MCA shown in FIG. 1A, respectively. Note that, all the memory cells MC included in the memory cell array MCA preferably have the same configuration.

The components of the memory cell MC[m, n] shown in FIG. 1B are described. The memory cell MC includes first and second P-channel transistors P1, P2, first to fourth N-channel transistors N1 to N4, a first storage node SN, and a second storage node /SN.

The connection relation between the components of the memory cell MC[m, n] shown in FIG. 1B is described. The cell power supply line ARVDD is coupled in common to a drain of a first P-channel transistor P1 and a drain of a second P-channel transistor P2. The local ground line ARVSS is coupled in common to a drain of the first N-channel transistor N1 and a drain of the second N-channel transistor N2. The first storage node SN is coupled in common to a source of the first P-channel transistor P1, a gate of the second P-channel transistor P2, a source of the first N-channel transistor N1, a gate of the second N-channel transistor N2, and a drain of a third N-channel transistor N3. The second storage node /SN is coupled in common to a gate of the first P-channel transistor P1, a source of the second P-channel transistor P2, a gate of the first N-channel transistor N1, a source of the second N-channel transistor N2, and a source of a fourth N-channel transistor N4. The m-th column word line WL[m] is coupled in common to a gate of the third N-channel transistor N3 and a gate of the fourth N-channel transistor N4. The first bit line BL[n] in the n-th row is coupled to a source of the third N-channel transistor N3. The second bit line /BL[n] in the n-th row is coupled to a drain of the fourth N-channel transistor N4.

A typical SRAM is formed by arranging various wirings in a plurality of overlapped wiring layers, and also by arranging vias and contacts that extend through all or some of the wiring layers and couple various wirings. Here, as an example, it is assumed that the wirings related to the memory cell shown in FIG. 1B are arranged in a first wiring layer that is the bottom layer. It is assumed that the first bit lines BL and BL[n], the second bit line /BL and /BL[n], and the cell power supply line ARVDD shown in FIGS. 1A and 1B are arranged in a second wiring layer formed over the first wiring layer. It is assumed that the word line WL and the local ground line ARVSS shown in FIGS. 1A and 1B are arranged in a third wiring layer formed over the second wiring layer.

FIG. 1C is a plan view extracting and showing the semiconductor substrate and the first wiring layer of the memory cell MC[m, n] shown in FIG. 1B and its peripheral region.

The components shown in FIG. 1C are described. First, over the semiconductor substrate, there are formed four N-channel impurity regions NW1 to NW4, four P-channel impurity regions PW1A, PW1B, PW2A and PW2B, and 12 gate electrode wirings G1 to G12. Note that, in regions other than the above-described regions over the semiconductor substrate, an element isolation region is formed. Next, 16 first layer wirings M101 to M116 are formed in the first wiring layer. Furthermore, between the semiconductor substrate and the first wiring layer, there are formed 18 first layer wiring-impurity region contacts VN11 to VN13, VN21 to VN23, VN31 to VN33, VN41 to VN43, VP11 to VP13, and VP21 to VP23 and four first layer wiring-gate electrode wiring contacts VG1 to VG4.

The positional relation and connection relation between the components shown in FIG. 1C are described. Four N-channel impurity regions NW1 to NW4 are formed in a shape long in the vertical direction of FIG. 1C, respectively. Two P-channel impurity regions PW1A and PW1B are arranged side by side in the vertical direction of FIG. 1C. Two P-channel impurity regions PW2A and PW2B are arranged side by side in the vertical direction of FIG. 1C. Four P-channel impurity regions PW1A, PW1B, PW2A, and PW2B are formed between two N-channel impurity regions NW2 and NW3. The N-channel impurity region NW1, the N-channel impurity region NW2, the P-channel impurity regions PW1A and PW1B, the P-channel impurity regions PW2A and PW2B, the N-channel impurity region NW3, and the N-channel impurity region NW4 are arranged in this order from the left to right in FIG. 1C. The N-channel impurity regions NW1 to NW4 and the P-channel impurity regions PW1A, PW1B, PW2A, and PW2B are isolated from each other by an element isolation region.

The gate electrode wirings G01 to G12 are formed in the horizontal direction of FIG. 1C, and are arranged over the N-channel impurity regions NW1 to NW4, the P-channel impurity regions PW1A, PW1B, PW2A and PW2B, and the element isolation region. The gate electrode wiring G01 is formed over the N-channel impurity region NW1. The gate electrode wiring G02 is formed straddling over the N-channel impurity region NW2 and the P-channel impurity regions PW1A and PW2A. The gate electrode wiring G03 is formed straddling over the N-channel impurity regions NW3 and NW4. In the example of FIG. 1C, the gate electrode wirings G01 to G03 are arranged side by side on a straight line.

The gate electrode wiring G04 is formed over the N-channel impurity region NW1. The gate electrode wiring G05 is formed straddling over the N-channel impurity region NW2 and the P-channel impurity regions PW1A and PW2B. The gate electrode wiring G06 is formed straddling over the N-channel impurity regions NW3 and NW4. In the example of FIG. 1C, the gate electrode wirings G04 to G06 are arranged side by side on a straight line.

The gate electrode wiring G07 is formed straddling over the N-channel impurity regions NW1 and NW2. The gate electrode wiring G08 is formed straddling over the P-channel impurity regions PW1A and PW2B and the N-channel impurity region NW3. The gate electrode wiring G09 is formed over the N-channel impurity region NW4. In the example of FIG. 1C, the gate electrode wirings G07 to G09 are arranged side by side on a straight line.

The gate electrode wiring G10 is formed straddling over the N-channel impurity regions NW1 and NW2. The gate electrode wiring G11 is formed straddling over the P-channel impurity regions PW1B and PW2B and the N-channel impurity region NW3. The gate electrode wiring G12 is formed over the N-channel impurity region NW4. In the example of FIG. 1C, the gate electrode wirings G10 to G12 are arranged side by side on a straight line.

The first layer wiring M101 is arranged straddling over the N-channel impurity regions NW1 and NW2. The first layer wiring M102 is arranged over the P-channel impurity region PW1A. The first layer wiring M103 is arranged over the N-channel impurity region NW3. The first layer wiring M104 is arranged over the gate electrode wiring G03. The first layer wiring M105 is arranged over the N-channel impurity region NW4.

The first layer wiring M106 is arranged over the N-channel impurity region NW1. The first layer wiring M107 is arranged over the gate electrode wiring G07. The first layer wiring M108 is arranged straddling over the N-channel impurity region NW2 and the P-channel impurity region PW1A. The first layer wiring M109 is arranged straddling over the P-channel impurity region PW2B and the N-channel impurity region NW3. The first layer wiring M110 is arranged over the gate electrode wiring G06. The first layer wiring M111 is arranged over the N-channel impurity region NW4.

The first layer wiring M112 is arranged over the N-channel impurity region NW1. The first layer wiring M113 is arranged over the gate electrode wiring G07. The first layer wiring M114 is arranged over the N-channel impurity region NW2. The first layer wiring M115 is arranged over the P-channel impurity region PW2B. The first layer wiring M116 is arranged straddling over the N-channel impurity regions NW3 and NW4.

The first layer wiring-impurity region contact VN11 couples the first layer wiring M101 and the N-channel impurity region NW1. The first layer wiring-impurity region contact VN12 couples the first layer wiring M106 and the N-channel impurity region NW1. The first layer wiring-impurity region contact VN13 couples the first layer wiring M112 and the N-channel impurity region NW1. The first layer wiring-impurity region contact VN21 couples the first layer wiring M101 and the N-channel impurity region NW2. The first layer wiring-impurity region contact VN22 couples the first layer wiring M108 and the N-channel impurity region NW2. The first layer wiring-impurity region contact VN23 couples the first layer wiring M114 and the N-channel impurity region NW2. The first layer wiring-impurity region contact VN31 couples the first layer wiring M103 and the N-channel impurity region NW3. The first layer wiring-impurity region contact VN32 couples the first layer wiring M109 and the N-channel impurity region NW3. The first layer wiring-impurity region contact VN33 couples the first layer wiring M116 and the N-channel impurity region NW3. The first layer wiring-impurity region contact VN41 couples the first layer wiring M105 and the N-channel impurity region NW4. The first layer wiring-impurity region contact VN42 couples the first layer wiring M111 and the N-channel impurity region NW4. The first layer wiring-impurity region contact VN43 couples the first layer wiring M116 and the N-channel impurity region NW4.

The first layer wiring-impurity region contact VP11 couples the first layer wiring M102 and the P-channel impurity region PW1A. The first layer wiring-impurity region contact VP12 couples the first layer wiring M108, the P-channel impurity region PW1A, and the gate electrode wiring G08. The first layer wiring-impurity region contact VP13 couples the P-channel impurity region PW1B and the gate electrode wiring G11. The first layer wiring-impurity region contact VP21 couples the P-channel impurity region PW2A and the gate electrode wiring G02. The first layer wiring-impurity region contact VP22 couples the first layer wiring M109, the P-channel impurity region PW2B, and the gate electrode wiring G05. The first layer wiring-impurity region contact VP23 couples the first layer wiring M115 and the P-channel impurity region PW2B.

The first layer wiring-gate electrode wiring contact VG1 couples the first layer wiring M104 and the gate electrode wiring G03. The first layer wiring-gate electrode wiring contact VG2 couples the first layer wiring M110 and the gate electrode wiring G06. The first layer wiring-gate electrode wiring contact VG3 couples the first layer wiring M107 and the gate electrode wiring G07. The first layer wiring-gate electrode wiring contact VG4 couples the first layer wiring M113 and the gate electrode wiring G10.

The operation of the components shown in FIG. 1C is described. A portion, of the gate electrode wiring G05, overlapping with the N-channel impurity region NW2 behaves as the gate of the N-channel transistor N1 shown in FIG. 1B. A portion, of the gate electrode wiring G05, overlapping with the P-channel impurity region PW1A behaves as the gate of the P-channel transistor P1 shown in FIG. 1B. A portion, of the gate electrode wiring G06, overlapping with the N-channel impurity region NW3 behaves as the gate of the N-channel transistor N4 shown in FIG. 1B. A portion, of the gate electrode wiring G07, overlapping with the N-channel impurity region NW2 behaves as the gate of the N-channel transistor N3 shown in FIG. 1B. A portion, of the gate electrode wiring G08, overlapping with the P-channel impurity region PW2B behaves as the gate of the P-channel transistor P2 shown in FIG. 1B. A portion, of the gate electrode wiring G07, overlapping with the N-channel impurity region NW3 behaves as the gate of the N-channel transistor N2 shown in FIG. 1B. The first layer wiring M108 behaves as the storage node SN shown in FIG. 1B. The first layer wiring M109 behaves as the storage node /SN shown in FIG. 1B.

Figure 1D:
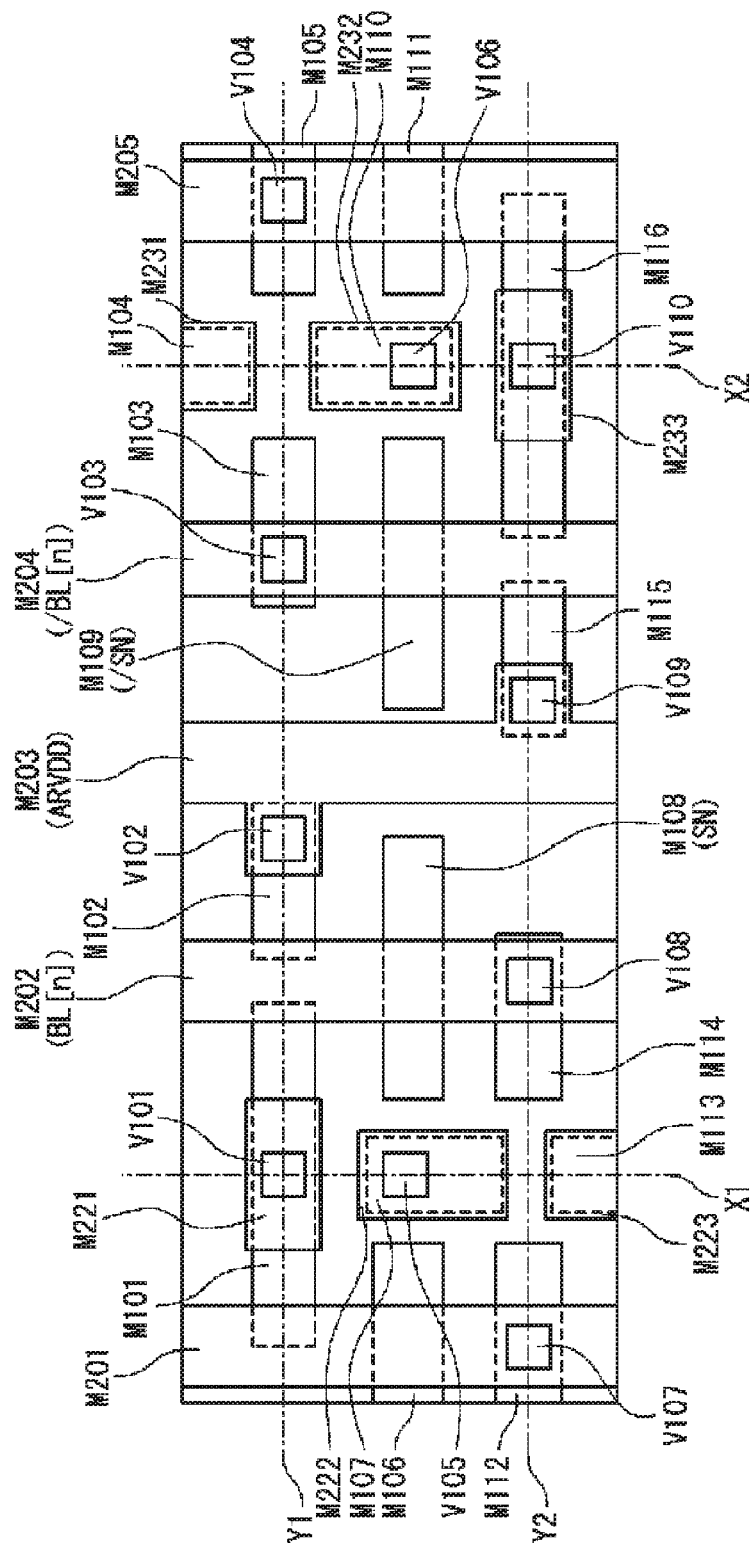
FIG. 1D is a plan view extracting and showing the first wiring layer and a second wiring layer of the region shown in FIG. 1C.

FIG. 1D is a plan view extracting and showing the first wiring layer and the second wiring layer of the region shown in FIG. 1C. Note that, border lines X1, X2, Y1, and Y2 shown in FIG. 1D indicate the same range as in the case of FIG. 1C.

The components shown in FIG. 1D are described. In the second wiring layer, there are formed second layer wirings M201 to M205, M221 to M223, and M231 to M233. The second layer wiring M203 includes a first projecting portion and a second projecting portion. In the first wiring layer, the first layer wirings M101 to M116 are formed. Between the first wiring layer and the second wiring layer, first layer wiring-second layer wiring contacts V101 to V110 are formed.

Note that, because the first layer wirings M101 to M116 are the same as in the case of FIG. 1C, further detailed description is omitted.

The positional relation and connection relation between the components shown in FIG. 1D are described. The second layer wirings M201 to M205 are formed in a shape long in the vertical direction of FIG. 1D, respectively. The second layer wirings M201 to M205 are arranged in this order from the left to right of FIG. 1D. The second layer wirings M221 to M223 are arranged side by side in the vertical direction of FIG. 1D and also arranged between the second layer wirings M201 and M202. The second layer wirings M231 to M233 are arranged side by side in the vertical direction of FIG. 1D and also arranged between the second layer wirings M204 and M205.

The second layer wiring M201 is arranged straddling over the first layer wirings M101, M106, and M112. The second layer wiring M202 is arranged straddling over the first layer wirings M101, M102, M108, and M114. The first projecting portion of the second layer wiring M203 is arranged over the first layer wiring M102. The second projecting portion of the second layer wiring M203 is arranged over the first layer wiring M115. The second layer wiring M204 is arranged straddling over the first layer wirings M103, M109, M115, and M116. The second layer wiring 205 is arranged straddling over the first layer wirings M105, M111, and M116.

The second layer wiring M221 is arranged over the first layer wiring M101. The second layer wiring M222 is arranged over the first layer wiring M107. The second layer wiring M223 is arranged over the first layer wiring M113. The second layer wiring M231 is arranged over the first layer wiring M104. The second layer wiring M232 is arranged over the first layer wiring M110. The second layer wiring M233 is arranged over the first layer wiring M116.

The first layer wiring-second layer wiring contact V101 couples the first layer wiring M101 and the second layer wiring M221. The first layer wiring-second layer wiring contact V102 couples the first layer wiring M102 and the first projecting portion of the second layer wiring M203. The first layer wiring-second layer wiring contact V103 couples the first layer wiring M103 and the second layer wiring M204. The first layer wiring-second layer wiring contact V104 couples the first layer wiring M105 and the second layer wiring M205. The first layer wiring-second layer wiring contact V105 couples the first layer wiring M107 and the second layer wiring M222. The first layer wiring-second layer wiring contact V106 couples the first layer wiring M110 and the second layer wiring M223. The first layer wiring-second layer wiring contact V107 couples the first layer wiring M112 and the second layer wiring M201. The first layer wiring-second layer wiring contact V108 couples the first layer wiring M114 and the second layer wiring M202. The first layer wiring-second layer wiring contact V109 couples the first layer wiring M115 and the second projecting portion of the second layer wiring M203. The first layer wiring-second layer wiring contact V110 couples the first layer wiring M116 and the second layer wiring M233.

The operation of the components shown in FIG. 1D is described. The second layer wirings M202 and M204 behave as the bit line pair BL[n] and /BL[n] shown in FIG. 1B, respectively. The second layer wiring M203 behaves as the cell power supply line ARVDD shown in FIG. 1B.

Note that, because the first layer wirings M101 to M116 are the same as in the case of FIG. 1C, further detailed description is omitted.

Figure 1E:
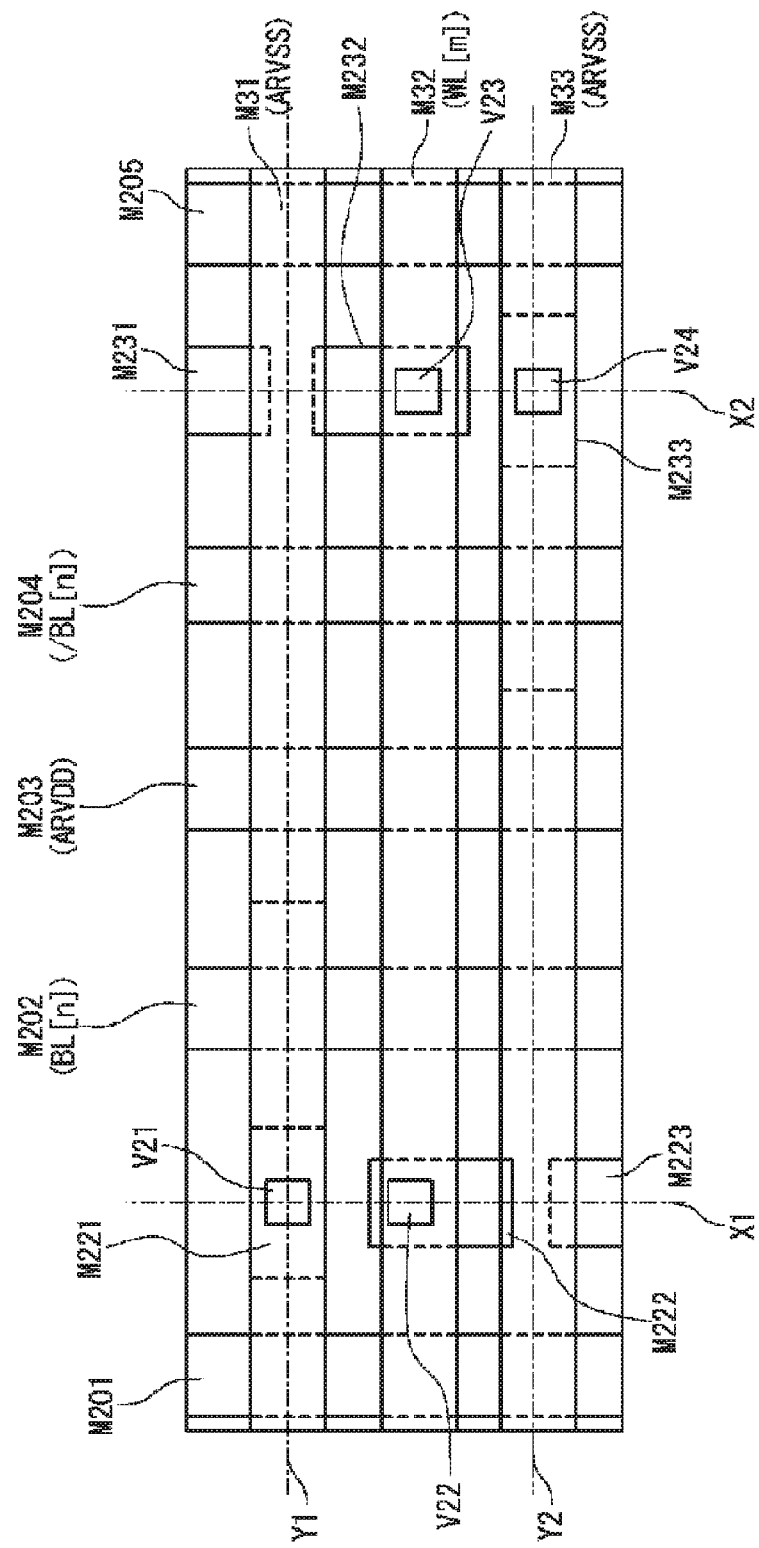
FIG. 1E is a plan view extracting and showing the second wiring layer and a third wiring layer of the region shown in FIG. 1C.

FIG. 1E is a plan view extracting and showing the second wiring layer and the third wiring layer of the region shown in FIG. 1C. Note that, the border lines X1, X2, Y1, and Y2 shown in FIG. 1E indicate the same range as in the case of FIGS. 1C and 1D.

The components shown in FIG. 1E are described. In the third wiring layer, the third layer wirings M31 to M33 are formed. In the second wiring layer, there are formed the second layer wirings M201 to M205, M221 to M223, and M231 to M233. Between the second wiring layer and the third wiring layer, second layer wiring-third layer wiring contacts V21 to V24 are formed.

Note that, because the second layer wirings M201 to M205, M221 to M223, and M231 to M233 are the same as in the case of FIG. 1D, further detailed description is omitted.

The positional relation and connection relation between the components shown in FIG. 1E are described. The third layer wirings M31 to M33 are formed in a shape long in the horizontal direction of FIG. 1E, respectively. The third layer wirings M31 to M33 are arranged in this order from top to bottom of FIG. 1E. The third layer wiring M31 is arranged straddling over the second layer wirings M201 to M205, M221, M231, and M232. The third layer wiring M32 is arranged straddling over the second layer wirings M201 to M205, M222, and M231. The third layer wiring M31 is arranged straddling over the second layer wirings M201 to M205, M222, M223, and M233.

The second layer wiring-third layer wiring contact V21 couples the second layer wiring M221 and the third layer wiring M31. The second layer wiring-third layer wiring contact V22 couples the second layer wiring M222 and the third layer wiring M32. The second layer wiring-third layer wiring contact V23 couples the second layer wiring M232 and the third layer wiring M32. The second layer wiring-third layer wiring contact V24 couples the second layer wiring M233 and the third layer wiring M33.

Note that, because the second layer wirings M201 to M205, M221 to M223, and M231 to M233 are the same as in the case of FIG. 1D, further detailed description is omitted.

The operation of the components shown in FIG. 1E is described. The third layer wirings M31 and M33 behave as the local ground line ARVSS shown in FIG. 1B. The third layer wiring M32 behaves as the word line WL[m] shown in FIG. 1B.

Note that, because the second layer wirings M201 to M205, M221 to M223, and M231 to M233 are the same as in the case of FIG. 1D, further detailed description is omitted.

Figure 1F:
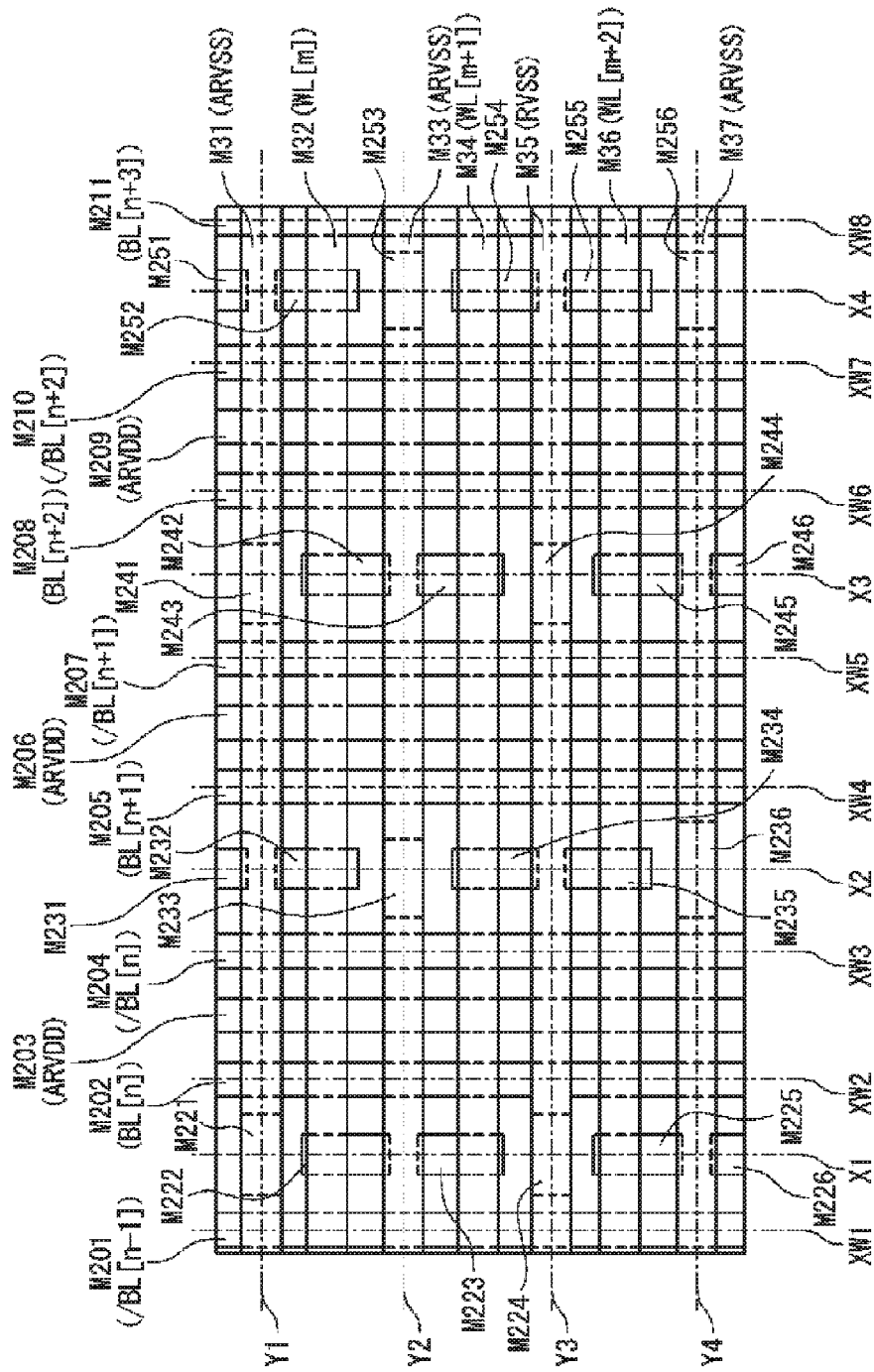
FIG. 1F is a plan view showing a wider range of the second wiring layer and third wiring layer shown in FIG. 1E.

FIG. 1F is a plan view showing a wider range of the second wiring layer and third wiring layer shown in FIG. 1E. Here, the border lines X1, X2, Y1, and Y2 indicate the same range as in the case of FIGS. 1C to 1E. That is, FIG. 1E shows the memory cell MC[m, n] shown in FIG. 1B and the range corresponding to its periphery, while FIG. 1F shows the memory cells MC[m, n] to MC[m+2, n+2] and the range corresponding to its periphery.

More specifically, a range surrounded on all four sides by the border lines X2, X3, Y1, and Y2 corresponds to the memory cell MC[m, n+1], a range surrounded on all four sides by the border lines X1, X2, Y2, and Y3 corresponds to the memory cell MC[m+1, n], and a range surrounded on all four sides by the border lines X3, X4, Y3, and Y4 corresponds to the memory cell MC[m+2, n+2].

The components shown in FIG. 1F are described. In the third wiring layer, the third layer wirings M31 to M37 are formed. In the second wiring layer, there are formed the second layer wirings M201 to M211, M221 to M226, M231 to M236, M241 to M246, and M251 to M256.

The positional relation and connection relation between the components shown in FIG. 1F are described. The components shown in FIG. 1F are periodically arranged in the vertical and horizontal directions, and its cycle corresponds to two memory cells MC. In other words, the components shown in FIG. 1F are arranged line-symmetrically to any of the border lines X1 to X4 and the border lines Y1 and Y2, within the range of the memory cell array.

That is, the positional relation and connection relation of the third layer wirings M34 and M36 are the same as in the case of the third layer wiring M32. The positional relation and connection relation of the third layer wirings M35 are the same as in the case of the third layer wiring M31. The positional relation and connection relation of the third layer wirings M37 are the same as in the case of the third layer wiring M33.

Moreover, the positional relation and connection relation of the second layer wirings M206 and M209 are the same as in the case of the second layer wiring M203. The positional relation and connection relation of the second layer wirings M207 and M208 are the same as in the case of the second layer wirings M201 and M202, respectively. The positional relation and connection relation of the second layer wirings M210 and M211 are the same as in the case of the second layer wirings M204 and M205, respectively. The positional relation and connection relation of the second layer wirings M224 to M226, M241 to M243, and M244 to M246 are the same as in the case of the second layer wiring M221 to M223, respectively. The positional relation and connection relation of the second layer wirings M234 to M236, M241 to M243, and M244 to M246 are the same as in the case of the second layer wirings M231 to M233, respectively.

These periodicity and symmetry are also true of the impurity regions over the semiconductor substrate omitted in FIG. 1F. That is, the P-channel impurity region is formed between the border lines XW1 and XW2, between the border lines XW3 and XW4, between the border lines XW5 and XW6, and between the border lines XW7 and XW8. Moreover, the N-channel impurity region is formed between the border lines XW2 and XW3, between the border lines XW4 and XW5, and between the border lines XW6 and XW7.

The operation of the components shown in FIG. 1F is described. The above-described periodicity and symmetry are also true here. That is, the second layer wiring M201 behaves as the bit line /BL[n−1]. The second layer wiring M202 behaves as the bit line BL[n]. The second layer wiring M203 behaves as the cell power supply line ARVDD. The second layer wiring M204 behaves as the bit line /BL[n]. The second layer wiring M205 behaves as the bit line BL[n+1]. The second layer wiring M206 behaves as the cell power supply line ARVDD. The second layer wiring M207 behaves as the bit line /BL[n+1]. The second layer wiring M208 behaves as the bit line BL[n+2]. The second layer wiring M209 behaves as the cell power supply line ARVDD. The second layer wiring M210 behaves as the bit line /BL[n+2]. The second layer wiring M211 behaves as the bit line BL[n+3].

Moreover, the third layer wiring M31 behaves as the local ground line ARVSS. The third layer wiring M32 behaves as the word line WL[n]. The third layer wiring M33 behaves as the local ground line ARVSS. The third layer wiring M34 behaves as the word line WL[n+1]. The third layer wiring M35 behaves as the local ground line ARVSS. The third layer wiring M36 behaves as the word line WL[n+2]. The third layer wiring M37 behaves as the local ground line ARVSS.

Figure 1G:
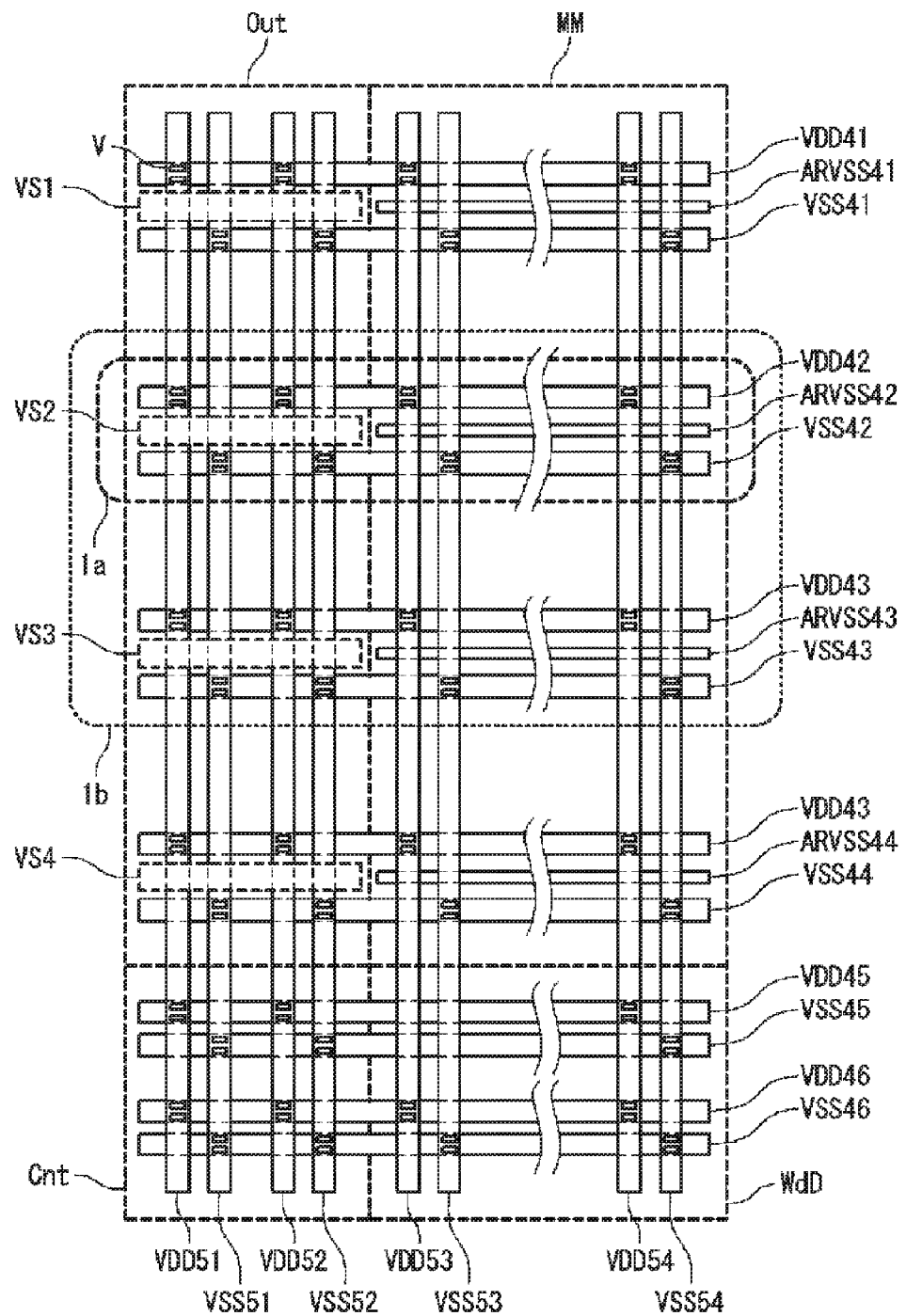
FIG. 1G is a plan view showing a positional relation between various wirings formed in a third wiring layer and a fourth wiring layer of an SRAM according to a conventional art.

FIG. 1G is a plan view showing a positional relation between various wirings formed in the third wiring layer and the fourth wiring layer of an SRAM according to a conventional art. These wirings shown in FIG. 1G include external power supply voltage lines VDD41 to VDD45 and VDD51 to VDD54, external ground voltage lines VSS41 to VDD45 and VSS51 to VSS54, local ground lines ARVSS41 to ARVSS44, and the vias V coupling these wirings. Note that, the number of these wirings and the number of these vias V shown in FIG. 1G are just one example, or only some of them are shown, and do not limit the semiconductor device of the present invention.

Among various wirings shown in FIG. 1G, the external power supply voltage lines VDD41 to VDD45, the external ground voltage lines VSS41 to VDD45, and the local ground lines ARVSS41 to ARVSS44 are arranged in parallel to the horizontal direction in FIG. 1G, in the third wiring layer. Among various wirings shown in FIG. 1G, the external power supply voltage lines VDD51 to VDD54 and the external ground voltage lines VSS51 to VSS54 are arranged in parallel to the vertical direction in FIG. 1G, in the fourth wiring layer. Among various wirings shown in FIG. 1G, the vias V are formed straddling at least between the third wiring layer and the fourth wiring layer, but may further straddle the other wiring layer.

Note that, the external power supply voltage lines VDD41 to VDD44 and the external ground voltage lines VSS41 to VSS44 shown in FIG. 1G are formed straddling the memory mat circuit MM and the output circuit Out shown in FIG. 1A. The external power supply voltage line VDD45 and the external ground voltage line VSS45 shown in FIG. 1G are arranged straddling the word driver circuit WdD and the control circuit Cnt shown in FIG. 1A. The external power supply voltage lines VDD51 and VDD52 and the external ground voltage lines VSS51 and VSS52 shown in FIG. 1G are arranged straddling the output circuit Out and the control circuit Cnt shown in FIG. 1A. The external power supply voltage lines VDD53 and VDD54 and the external ground voltage lines VSS53 and VSS54 shown in FIG. 1G are arranged straddling the memory mat circuit MM and the word driver circuit WdD shown in FIG. 1A. The local ground lines ARVSS41 to ARVSS44 shown in FIG. 1G are arranged in the memory mat circuit MM, and also arranged between the external power supply voltage lines VDD41 to VDD45 and the external ground voltage lines VSS41 to VSS45 having the same number. That is, for example, the local ground line ARVSS42 is arranged between the external power supply voltage line VDD42 and the external ground voltage line VSS42.

The via V shown in FIG. 1G is arranged at an intersection between the external power supply voltage lines VDD41 to VDD45 and the external power supply voltage lines VDD51 to VDD54 and at an intersection between the external ground voltage lines VSS41 to VSS45 and the external ground voltage lines VSS51 to VSS54. In the example shown in FIG. 1G, all the external power supply voltage lines VDD41 to VDD45 and VDD51 to VDD54 and the external ground voltage lines VSS41 to VSS45 and VSS51 to VSS54 have the same width. Accordingly, the shape at the each intersection is square or rectangular near thereto. Here, in the example shown in FIG. 1G, the shape of the via V is laterally long rectangular, and two rectangular vias V are arranged at the each intersection.

The connection relation between various wirings of the SRAM shown in FIG. 1G is described. The external power supply voltage lines VDD41 to VDD45 are coupled to the external power supply voltage lines VDD51 to VDD54 via the vias V, respectively. The external ground voltage lines VSS41 to VSS45 are coupled to the external ground voltage lines VSS51 to VSS54 via the vias V, respectively.

A wiring portion 1a enclosed by a dotted line and shown in FIG. 1G is focused on. The wiring portion 1a includes the external power supply voltage line VDD42, the local ground line ARVSS42, the external ground voltage line VSS42, some of the external power supply voltage lines VDD51 to VDD54, some of the external ground voltage lines VSS51 to VSS54, and the vias V coupling these wirings.

In the wiring portion 1a shown in FIG. 1G, of a region between the external power supply voltage line VDD42 and the external ground voltage line VSS42, in a region on the extension of the local ground line ARVSS42, i.e., in a region included in the output circuit Out, a free space VS2 remains in the fourth wiring layer. This free space is present also on the extension in each of the other local ground lines ARVSS41, ARVSS43, and ARVSS44, as with the case of the wiring portion 1a. Hereinafter, as examples making efficient use of such free space, the wiring portion 1a will be described, but these examples shall be applicable to all the free spaces.

FIG. 1H is a block circuit diagram schematically showing the configuration of wirings related to a local ground line of a memory cell array in a typical SRAM. The components shown in FIG. 1H are described. The block circuit diagram shown in FIG. 1H includes the memory cell array MCA, the output circuit Out, and the first and second ground line switch circuits ARGSw1 and ARGSw2. Here, each of the first and second ground line switch circuits ARGSw1 and ARGSw2 includes a standby signal line STB, the external ground voltage line VSS, the local ground line ARVSS, and a plurality of N-channel transistors NS1 and NS2. The memory cell array MCA includes a plurality of word lines WL formed in the third wiring layer, a plurality of local ground lines ARVSS formed in the third wiring layer, and a plurality of local ground lines ARVSS formed in the fourth wiring layer.

The positional relation and connection relation between the components shown in FIG. 1H are described. The first ground line switch circuit ARGSw1, the memory cell array MCA, the second ground line switch circuit ARGSw2, and the output circuit Out are arranged in this order from the right to left of FIG. 1H. In particular, the memory cell array MCA is arranged between the first and second ground line switch circuits ARGSw1 and ARGSw2.

In each of the N-channel transistors NS1 included in the first and second ground line switch circuits ARGSw1 and ARGSw2, the gate is coupled to the standby signal line STB. Similarly, one of the source and the drain is coupled to the external ground voltage line VSS, and the other one is coupled to the local ground line ARVSS.

In each of the N-channel transistors NS2 included in the first and the second ground line switch circuits ARGSw1 and ARGSw2, one of the source and the drain is coupled to the external ground voltage line VSS, and the other one and the gate are coupled in common to the local ground line ARVSS.

The local ground lines ARVSS formed in the fourth wiring layer of the memory cell array MCA are arranged in parallel. A spacing between these local ground lines ARVSS of the fourth wiring layer is designated as D. The spacing D corresponds to N memory cells MC. Here, N is an integer of two or more, and is 16 in this example. In other words, one local ground line ARVSS is arranged for every 16 memory cells MC.

The local ground lines ARVSS formed in the third wiring layer of the memory cell array MCA and the word lines WL also formed in the third wiring layer are arranged in parallel and alternately, and are also perpendicular to the local ground lines ARVSS formed also in the fourth wiring layer.

For the local ground lines ARVSS formed in the fourth wiring layer of the memory cell array MCA, one endis respectively coupled to the local ground line ARVSS included in the first ground line switch circuit ARGSw1, and the other ends are respectively coupled to the local ground line ARVSS included in the second ground line switch circuit ARGSw2. Moreover, the local ground lines ARVSS formed in the fourth wiring layer of the memory cell array MCA are respectively coupled to the local ground lines ARVSS, which are also formed in the third wiring layer, via a plurality of the non-illustrated third wiring layer-fourth wiring layer contacts.

The operation of the components shown in FIG. 1H is described. In the first and second ground line switch circuits ARGSw1 and ARGSw2, a common standby signal is supplied to the gates of the N-channel transistors NS1. When stand-by instruction is given to the SRAM, the standby signal is set to a high level, and thereby the N-channel transistor NS1 is turned off. At this time, by means of a diode-connected N-channel transistor NS2, the voltage of the local ground line ARVSS is kept higher than the external ground voltage Vss by a threshold voltage Vth. Note that, here the external ground voltage Vss is equal to 0 V. It is assumed that, as a result, a voltage to an extent that the retained data will not be erased is supplied to the memory cell array.

To the contrary, the N-channel transistor NS1 is turned on by setting the standby signal to a low level, and the voltage of the local ground line ARVSS becomes approximately the same as the external ground voltage Vss, i.e., 0 V. Note that, it is assumed that a ground voltage is supplied from the outside of the SRAM to the external ground voltage line VSS. Moreover, it is assumed that the standby signal is generated inside the SRAM circuit based on an arbitrary mode signal supplied from the outside of the SRAM.

FIG. 1I is a block circuit diagram schematically showing the configuration of wirings related to the external power supply voltage line VDD and the external ground voltage line VSS of the memory cell array in a typical SRAM. The components shown in FIG. 1I are described. The block circuit diagram shown in FIG. 1I includes the memory cell array MCA, the output circuit Out, the first and second ground line switch circuits ARGSw1 and ARGSw2, a plurality of external power supply voltage lines VDD, a plurality of external ground voltage lines VSS, a plurality of local ground lines ARVSS, and a plurality of signal lines SGN. The memory cell array MCA includes a plurality of memory cell array subgroups MCASG, a plurality of well power-feeding voltage lines VDDW, and a plurality of well grounding voltage lines VSSW.

The positional relation and connection relation between the components shown in FIG. 1I are described. The first ground line switch circuit ARGSw1, the memory cell array MCA, the second ground line switch circuit ARGSw2, and the output circuit Out are arranged in this order from right to left of FIG. 1I.

In the memory cell array MCA, the well power-feeding voltage lines VDDW and the well grounding voltage lines VSSW are formed in the vertical direction of FIG. 1I, respectively, and each one of the well power-feeding voltage lines VDDW and each one of the well grounding voltage lines VSSW are paired, and are arranged in parallel and side by side in the horizontal direction of FIG. 1I. Between the pairs, one memory cell array subgroup MCASG is arranged. In other words, one well power-feeding voltage line VDDW, one well grounding voltage line VSSW, and one memory cell array subgroup MCASG are periodically arranged in the horizontal direction of FIG. 1I.

Note that, in one memory cell array subgroup MCASG, M memory cells MC are arranged side by side in the horizontal direction of FIG. 1I. Here, M is an integer of two or more, and is 64 in this example. In this case, in other words, for every 64 memory cells MC, the well power-feeding voltage line VDDW and the well grounding voltage line VSSW are arranged.

The external power supply voltage lines VDD, the external ground voltage lines VSS, the local ground lines ARVSS, and the signal lines SGN are formed in the horizontal direction of FIG. 1I, i.e., in the direction perpendicular to the well power-feeding voltage line VDDW and the well grounding voltage line VSSW, and are also arranged in parallel in the vertical direction of FIG. 1I.

The local ground line ARVSS extends from the first ground line switch circuit ARGSw1 to the second ground line switch circuit ARGSw2, straddling the memory cell array MCA. The external power supply voltage line VDD and the external ground voltage line VSS extend from the first ground line switch circuit ARGSw1 to the output circuit Out, straddling the memory cell array MCA and the second ground line switch circuit ARGSw2. The signal line SGN extends straddling the first ground line switch circuit ARGSw1, the memory cell array MCA, the second ground line switch circuit ARGSw2, and the output circuit Out.

The external power supply voltage lines VDD are respectively coupled to the well power-feeding voltage lines VDDW via a plurality of non-illustrated contacts. Similarly, the external ground voltage lines VSS are respectively coupled to the well grounding voltage lines VSSW via a plurality of non-illustrated contacts.

The operation of the components shown in FIG. 1I is described. The well power-feeding voltage line VDDW is formed in the third wiring layer, and supplies the external power supply voltage Vdd to an N-channel impurity region over the semiconductor substrate via an underlying wiring, a contact, and the like. Similarly, the well grounding voltage line VSSW is formed in the third wiring layer, and supplies the external ground voltage Vss to a P-channel impurity region over the semiconductor substrate via an underlying wiring, a contact, and the like.

Figure 1J:
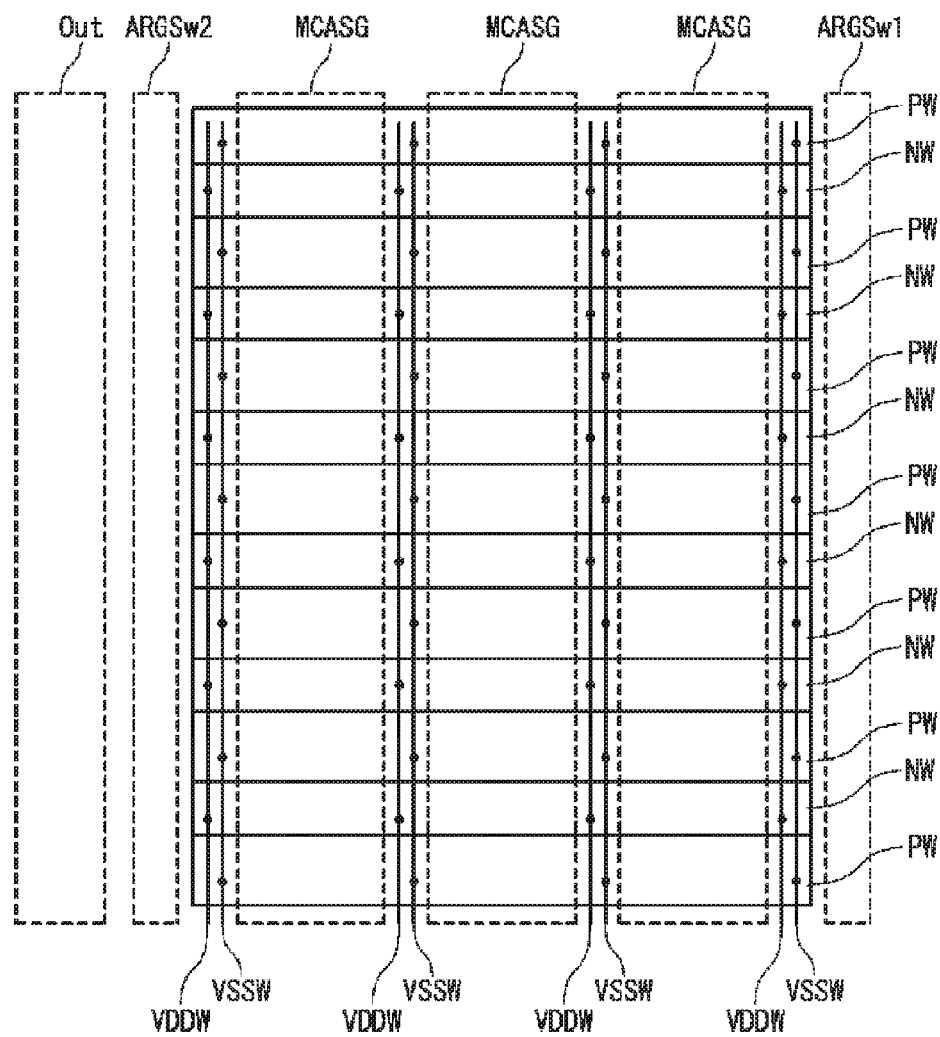
FIG. 1J is a block circuit diagram schematically showing the configuration of an impurity region in the typical SRAM and wirings related to power feeding to the impurity region.

FIG. 1J is a block circuit diagram schematically showing the configuration of an impurity region in a typical SRAM and wirings related to the power feeding to the impurity region. The components shown in FIG. 1J are described. The block circuit diagram shown in FIG. 1J includes the first ground line switch circuit ARGSw1, a plurality of memory cell array subgroups MCASG, a plurality of well power-feeding voltage lines VDDW, a plurality of well grounding voltage lines VSSW, a plurality of P-channel impurity regions PW, a plurality of N-channel impurity regions NW, the second ground line switch circuit ARGSw2, and the output circuit Out.

The positional relation and connection relation between the components shown in FIG. 1J are described. First, because the positional relation between the first ground line switch circuit ARGSw1, the memory cell array subgroups MCASG, the well power-feeding voltage lines VDDW, the well grounding voltage lines VSSW, the second ground line switch circuit ARGSw2, and the output circuit Out is the same as in the case of FIG. 1I, further detailed description is omitted.

Next, the P-channel impurity regions PW and the N-channel impurity regions NW are formed in a region corresponding to the memory cell array MCA over the semiconductor substrate, i.e., the well power-feeding voltage lines VDDW and the well grounding voltage lines VSSW are arranged overlapping with each other over the semiconductor substrate.

The P-channel impurity regions PW and the N-channel impurity regions NW are formed in a shape long in the horizontal direction of FIG. 1J, respectively, and are also alternatively arranged in the vertical direction of FIG. 1J. Accordingly, the respective P-channel impurity regions PW intersect with all the well grounding voltage lines VSSW. Similarly, the respective N-channel impurity regions NW intersect orthogonally with all the well power-feeding voltage lines VDDW.

The P-channel impurity regions PW and the well grounding voltage lines VSSW are coupled to each other via non-illustrated wirings, contacts, and the like. Similarly, the N-channel impurity regions NW and the well power-feeding voltage lines VDDW are coupled to each other via non-illustrated wiring, contacts, and the like. In FIG. 1J, the connection relation between these components is schematically shown as a connection point.

Figure 2A:
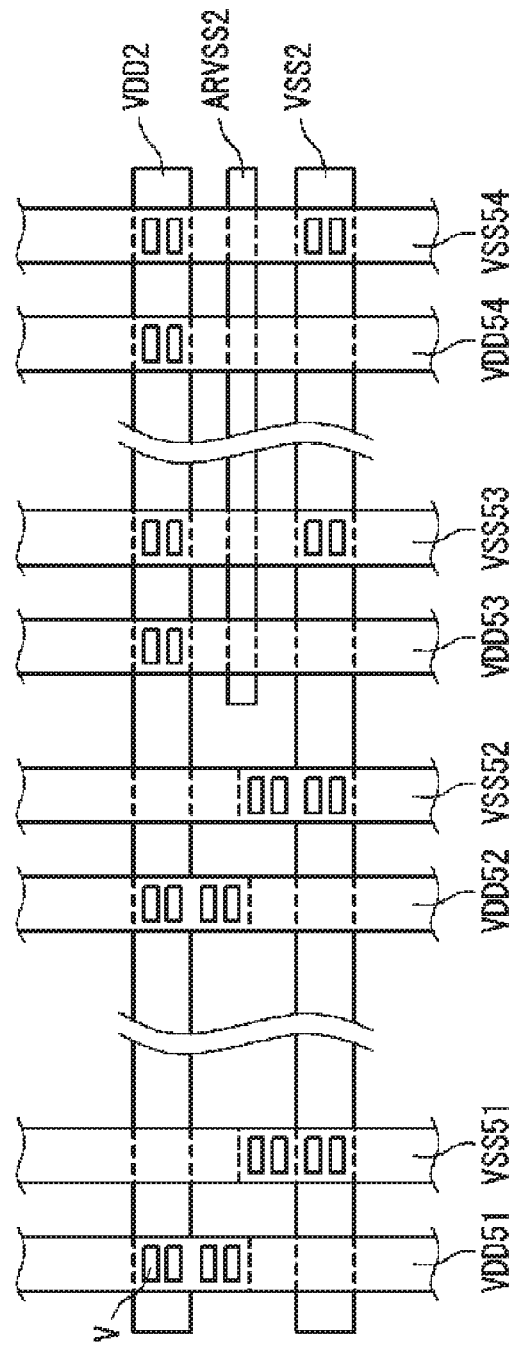
FIG. 2A is a plan view showing the configuration of a wiring portion 2 according to a first embodiment.

FIG. 2A is a plan view showing the configuration of a wiring portion 2 according to a first embodiment. The components of the wiring portion 2 shown in FIG. 2A are described. The wiring portion 2 shown in FIG. 2A includes the external power supply voltage lines VDD2 and VDD51 to VDD54, the external ground voltage lines VSS2 and VSS51 to VSS54, the local ground line ARVSS2, and the vias V.

Here, the external power supply voltage lines VDD51 to VDD54 and the external ground voltage lines VSS51 to VSS54 shown in FIG. 2A are assumed to be identical to the external power supply voltage lines VDD51 to VDD54 and the external ground voltage lines VSS51 to VSS54 shown in FIG. 1G, respectively. Moreover, the external power supply voltage line VDD2, the external ground voltage line VSS2, and the local ground line ARVSS2 shown in FIG. 2A are assumed to correspond to the external power supply voltage line VDD42, the external ground voltage line VSS42, and the local ground line ARVSS42 shown in FIG. 1G, respectively. In this manner, the wiring portion 2 shown in FIG. 2A is assumed to be used in substitution for the wiring portion 1a in the SRAM shown in FIG. 1G.

FIG. 2B is a plan view showing the configuration of the external power supply voltage line VDD2 and the external ground voltage line VSS2 according to the first embodiment. The external power supply voltage line VDD2 shown in FIGS. 2A and 2B is equal to the external power supply voltage line VDD42 shown in FIG. 1G having two projecting portions 2D1 and 2D2 integrally added thereto.

Here, the first projecting portion 2D1 is arranged at an intersecting portion between the external power supply voltage line VDD2 and the external power supply voltage line VDD51 so that the area of this intersecting portion increases. In this intersecting portion, more vias V than those shown in FIG. 1G are formed in accordance with the increased area to couple the external power supply voltage line VDD2 and the external power supply voltage line VDD51. These vias V may be separately treated as a via group coupled to the first projecting portion 2D1 and the other via group coupled to the other intersecting portions, for convenience, but the via V straddling both regions may be further formed.

Similarly, the second projecting portion 2D2 is arranged at an intersecting portion between the external power supply voltage line VDD2 and the external power supply voltage line VDD52 so that the area of this intersecting portion increases. In this intersecting portion, more vias V than those shown in FIG. 1G are formed in accordance with the increased area to couple the external power supply voltage line VDD2 and the external power supply voltage line VDD52. These vias V may be separately treated as a via group coupled to the second projecting portion 2D2 and the other via group coupled to the other intersecting portions, for convenience, but the via V straddling both regions may be further formed.

Moreover, the external ground voltage line VSS2 shown in FIGS. 2A and 2B is equal to the external ground voltage line VSS42 shown in FIG. 1G having two projecting portions 2S1 and 2S2 integrally added thereto.

Here, the first projecting portion 2S1 is arranged at an intersecting portion between the external ground voltage line VSS2 and the external ground voltage line VSS51 so that the area of this intersecting portion increases. In this intersecting portion, more vias V than those shown in FIG. 1G are formed in accordance with the increased area to couple the external ground voltage line VSS2 and the external ground voltage line VSS51. These vias V may be separately treated as a via group coupled to the first projecting portion 2S1 and the other via group coupled to the other intersecting portions, for convenience, but the via V straddling both regions may be further formed.

Similarly, the second projecting portion 2S2 is arranged at an intersecting portion between the external ground voltage line VSS2 and the external ground voltage line VSS52 so that the area of this intersecting portion increases. In this intersecting portion, more vias V than those shown in FIG. 1G are formed in accordance with the increased area to couple the external ground voltage line VSS2 and the external ground voltage line VSS52. These vias V may be separately treated as a via group coupled to the second projecting portion 2S2 and the other via group coupled to the other intersecting portions, for convenience, but the via V straddling both regions may be further formed.

In the wiring portion 2 according to the first embodiment, from left to right in FIGS. 2A and 2B, the first projecting portions 2D1 and 2S1 and the second projecting portions 2D2 and 2S2 in each of the external power supply voltage line VDD2 and the external ground voltage line VSS2 are alternately arranged in this order. This is because in order to form as many vias V as possible in each projecting portion, a shape as long as possible has been selected in the vertical direction of FIGS. 2A and 2B in a region between the external power supply voltage line VDD2 and the external ground voltage line VSS2.

The use of the wiring portion 2 according to the first embodiment shown in FIGS. 2A and 2B provides the following effect. That is, the power supply circuit of the semiconductor device is reinforced by increasing a total number of vias V transmitting the external power supply voltage Vdd and the external ground voltage Vss between the wiring layers. The embodiment is effective especially when a drop of a power supply voltage and/or power EM is restrained by a total number of vias V.

Second Embodiment

FIG. 3A is a plan view showing the configuration of a wiring portion 3 according to a second embodiment. The components of the wiring portion 3 shown in FIG. 3A are described. The wiring portion 3 shown in FIG. 3A includes the external power supply voltage lines VDD3 and VDD51 to VDD54, the external ground voltage lines VSS3 and VSS51 to VSS54, the local ground line ARVSS3, and the vias V.

Here, the external power supply voltage lines VDD51 to VDD54 and the external ground voltage lines VSS51 to VSS54 shown in FIG. 3A are assumed to be identical to the external power supply voltage lines VDD51 to VDD54 and the external ground voltage lines VSS51 to VSS54 shown in FIG. 1G, respectively. Moreover, the external power supply voltage line VDD3, the external ground voltage line VSS3, and the local ground line ARVSS3 shown in FIG. 3A are assumed to correspond to the external power supply voltage line VDD42, the external ground voltage line VSS42, and the local ground line ARVSS42 shown in FIG. 1G, respectively. In this manner, the wiring portion 3 shown in FIG. 3A is assumed to be used in substitution for the wiring portion 1a in the SRAM shown in FIG. 1G.

FIG. 3B is a plan view showing the configuration of the external power supply voltage line VDD3 and the external ground voltage line VSS3 according to the second embodiment. The external power supply voltage line VDD3 shown in FIGS. 3A and 3B is equal to the external power supply voltage line VDD42 shown in FIG. 1G having a projecting portion 3D integrally added thereto.

Due to the addition of the projecting portion 3D, the width of a portion, of the external power supply voltage line VDD3, included in the output circuit Out is wider than in the case of the external power supply voltage line VDD42 shown in FIG. 1G. In other words, due to the addition of the projecting portion 3D, the width of a portion, of the external power supply voltage line VDD3, intersecting with the external power supply voltage lines VDD51 and VDD52 is wider than in the case of the external power supply voltage line VDD42 shown in FIG. 1G. As a result, the area of the intersecting portion between the external power supply voltage line VDD3 and the external power supply voltage lines VDD51 and VDD52 increases. In these intersecting portions, more vias V than those shown in FIG. 1G are formed in accordance with the increased area to couple the external power supply voltage line VDD3 to the external power supply voltage lines VDD51 and VDD52, respectively. These vias V may be separately treated as a via group coupled to the projecting portion 3D and the other via group coupled to the other intersecting portions, for convenience, but the via V straddling both regions may be further formed.

Similarly, the external ground voltage line VSS3 shown in FIGS. 3A and 3B is equal to the external ground voltage line VSS42 shown in FIG. 1G having a projecting portion 3S integrally added thereto.

Due to the addition of the projecting portion 3S, a portion, of the external ground voltage line VSS3, included in the output circuit Out is wider than in the case of the external ground voltage line VSS42 shown in FIG. 1G. In other words, due to the addition of the projecting portion 3S, the width of a portion, of the external ground voltage line VSS3, intersecting with the external ground voltage lines VSS51 and VSS52 is wider than in the case of the external ground voltage line VSS42 shown in FIG. 1G. As a result, the area of the intersecting portion between the external ground voltage line VSS3 and the external ground voltage lines VSS51 and VSS52 increases. In these intersecting portions, more vias V than those shown in FIG. 1G are formed in accordance with the increased area to couple the external ground voltage line VSS3 to the external ground voltage lines VSS51 and VSS52, respectively. These vias V may be separately treated as a via group coupled to the projecting portion 3S and the other via group coupled to the other intersecting portions, for convenience, but the via V straddling both regions may be further formed.

In the projecting portions 3D and 3S shown in FIGS. 3A and 3B, a collar portion, in which the via V is not formed, is provided also in other than the intersecting portions between the external power supply voltage lines VDD51 and VDD52 and between the external ground voltage lines VSS51 and VSS52. By providing this collar portion, the width of the portion included in the output circuit Out becomes uniform in each of the external power supply voltage line VDD3 and the external ground voltage line VSS3. Note that, the external power supply voltage line VDD3 and the external ground voltage line VSS3 may be formed so that the wiring widths of the both become the same as shown in FIGS. 3A and 3B, in view of the symmetry as a power supply circuit, but this feature is just an example and does not limit the present embodiment.

The use of the wiring portion 3 according to the second embodiment shown in FIGS. 3A and 3B provides the following effects. That is, the power supply circuit of the semiconductor device is reinforced by increasing a total number of vias V transmitting the external power supply voltage Vdd and the external ground voltage Vss between the wiring layers and increasing the width of the power supply wiring. The embodiment is effective especially when a drop of a power supply voltage and/or power EM is restrained by a total number of vias V and the width of the power supply wiring.

Third Embodiment

FIG. 4A is a plan view showing the configuration of a wiring portion 4 according to a third embodiment. The components of the wiring portion 4 shown in FIG. 4A are described. The wiring portion 4 shown in FIG. 4A includes the external power supply voltage lines VDD4 and VDD51 to VDD54, the external ground voltage lines VSS4 and VSS51 to VSS54, the local ground line ARVSS4, and the vias V.

Here, the external power supply voltage lines VDD51 to VDD54 and the external ground voltage lines VSS51 to VSS54 shown in FIG. 4A are assumed to be identical to the external power supply voltage lines VDD51 to VDD54 and the external ground voltage lines VSS51 to VSS54 shown in FIG. 1G, respectively. However, in FIG. 4A, the arrangement is exchanged between the external power supply voltage line VDD51 and the external ground voltage line VSS51.

Moreover, the external power supply voltage line VDD4, the external ground voltage line VSS4, and the local ground line ARVSS4 shown in FIG. 4A are assumed to correspond to the external power supply voltage line VDD42, the external ground voltage line VSS42, and the local ground line ARVSS42 shown in FIG. 1G, respectively. In this manner, the wiring portion 4 shown in FIG. 4A is assumed to be used in substitution for the wiring portion 1a in the SRAM shown in FIG. 1G.

FIG. 4B is a plan view showing the configuration of the external power supply voltage line VDD4 and the external ground voltage line VSS4 according to the third embodiment. The external power supply voltage line VDD4 shown in FIGS. 4A and 4B is equal to the external power supply voltage line VDD42 shown in FIG. 1G having a projecting portion 4D integrally added thereto.

Due to the addition of the projecting portion 4D, the width of a portion, of the external power supply voltage line VDD4, included in the output circuit Out is wider than in the case of the external power supply voltage line VDD42 shown in FIG. 1G. In other words, due to the addition of the projecting portion 4D, the width of a portion, of the external power supply voltage line VDD4, intersecting with the external power supply voltage lines VDD51 and VDD52 is wider than in the case of the external power supply voltage line VDD42 shown in FIG. 1G. As a result, the area of the intersecting portion between the external power supply voltage line VDD4 and the external power supply voltage lines VDD51 and VDD52 increases. In these intersecting portions, more vias V than those shown in FIG. 1G are formed in accordance with the increased area to couple the external power supply voltage line VDD4 to the external power supply voltage lines VDD51 and VDD52, respectively. These vias V may be separately treated as a via group coupled to the projecting portion 4D and the other via group coupled to the other intersecting portions, for convenience, but the via V straddling both regions may be further formed.

Moreover, the external ground voltage line VSS4 shown in FIGS. 4A and 4B is equal to the external ground voltage line VSS42 shown in FIG. 1G having two projecting portions 4S1 and 4S2 integrally added thereto.

Here, the first projecting portion 4S1 is arranged at an intersecting portion between the external ground voltage line VSS4 and the external ground voltage line VSS51 so that the area of this intersecting portion increases. In this intersecting portion, more vias V than those shown in FIG. 1G are formed in accordance with the increased area to couple the external ground voltage line VSS4 and the external ground voltage line VSS51. These vias V may be separately treated as a via group coupled to the first projecting portion 4S1 and the other via group coupled to the other intersecting portions, for convenience, but the via V straddling both regions may be further formed.

Similarly, the second projecting portion 4S2 is arranged at an intersecting portion between the external ground voltage line VSS4 and the external ground voltage line VSS52 so that the area of this intersecting portion increases. In this intersecting portion, more vias V than those shown in FIG. 1G are formed in accordance with the increased area to couple the external ground voltage line VSS4 and the external ground voltage line VSS52. These vias V may be separately treated as a via group coupled to the second projecting portion 4S2 and the other via group coupled to the other intersecting portions, for convenience, but the via V straddling both regions may be further formed.

In the wiring portion 4 according to the third embodiment, from left to right in FIGS. 4A and 4B, the first projecting portion 4S1 of the external ground voltage line VSS4, the projecting portion 4D of the external power supply voltage line VDD4, and the second projecting portion 4S2 of the external ground voltage line VSS4 are alternately arranged in this order. This is because as with the first embodiment, the shape of each projecting portion is set as long as possible in the vertical direction in FIGS. 4A and 4B, and also as with the second embodiment, the width of a portion, of the external power supply voltage line VDD4, included in the output circuit Out has been increased. Note that, in the wiring portion 4 according to the present embodiment, the shape of the external power supply voltage line VDD4 and the shape of the external ground voltage line VSS4 can be easily exchanged. In this case, the positional relation between the external power supply voltage lines VDD51 and VDD52 and the external ground voltage lines VSS51 and VSS52 are changed as required.

The use of the wiring portion 4 according to the third embodiment shown in FIGS. 4A and 4B provides the following effect. That is, the power supply circuit of the semiconductor device is reinforced by increasing a total number of vias V transmitting the external power supply voltage Vdd and the external ground voltage Vss between the wiring layers and increasing the width of apart of the power supply wiring. The embodiment is effective especially when a drop of a power supply voltage and/or power EM is restrained by a total number of vias V and the width of either one of the external power supply voltage line and the external ground voltage line.

Fourth Embodiment

Figure 5A:
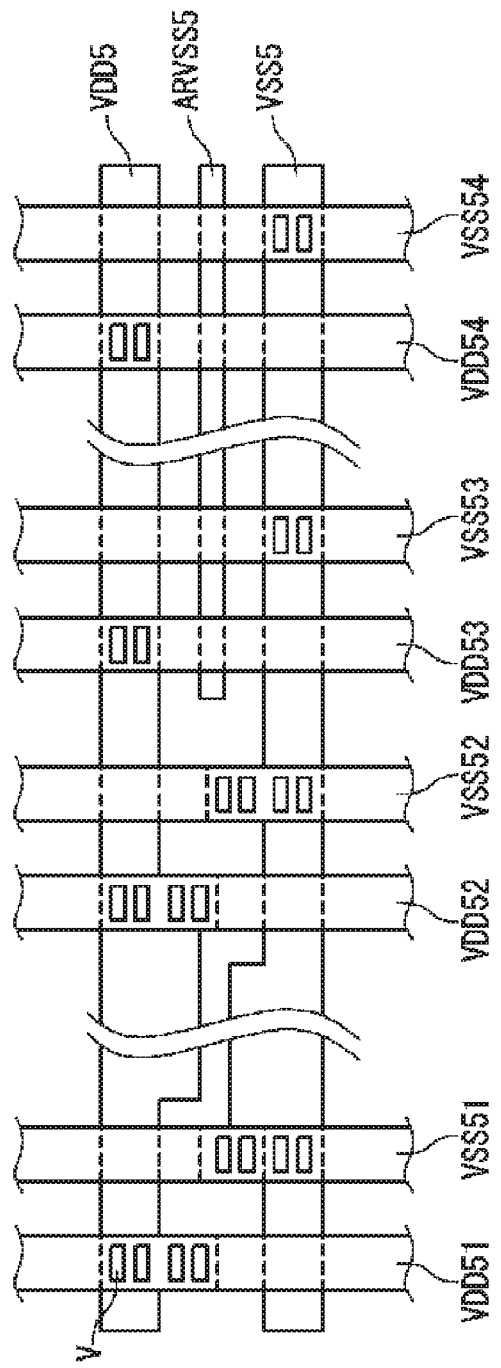
FIG. 5A is a plan view showing the configuration of a wiring portion 5 according to a fourth embodiment.

FIG. 5A is a plan view showing the configuration of a wiring portion 5 according to a fourth embodiment. The components of the wiring portion 5 shown in FIG. 5A are described. The wiring portion 5 shown in FIG. 5A includes the external power supply voltage lines VDD5 and VDD51 to VDD54, the external ground voltage lines VSS5 and VSS51 to VSS54, the local ground line ARVSS5, and the vias V.

Here, the external power supply voltage lines VDD51 to VDD54 and the external ground voltage lines VSS51 to VSS54 shown in FIG. 5A are assumed to be identical to the external power supply voltage lines VDD51 to VDD54 and the external ground voltage lines VSS51 to VSS54 shown in FIG. 1G, respectively. Moreover, the external power supply voltage line VDD5, the external ground voltage line VSS5, and the local ground line ARVSS5 shown in FIG. 5A are assumed to correspond to the external power supply voltage line VDD42, the external ground voltage line VSS42, and the local ground line ARVSS42 shown in FIG. 1G, respectively. In this manner, the wiring portion 5 shown in FIG. 5A is assumed to be used in substitution for the wiring portion 1a in the SRAM shown in FIG. 1G.

FIG. 5B is a plan view showing the configuration of the external power supply voltage line VDD5 and the external ground voltage line VSS5 according to the fourth embodiment. The external power supply voltage line VDD5 shown in FIGS. 5A and 5B is equal to the external power supply voltage line VDD42 shown in FIG. 1G having two projecting portions 5D1 and 5D2 integrally added thereto.

Here, the first projecting portion 5D1 is arranged at an intersecting portion between the external power supply voltage line VDD5 and the external power supply voltage line VDD51 so that the area of this intersecting portion increases. In this intersecting portion, more vias V than those shown in FIG. 1G are formed in accordance with the increased area to couple the external power supply voltage line VDD5 and the external power supply voltage line VDD51. These vias V may be separately treated as a via group coupled to the first projecting portion 5D1 and the other via group coupled to the other intersecting portions, for convenience, but the via V straddling both regions may be further formed.

Similarly, the second projecting portion 5D2 is arranged at an intersecting portion between the external power supply voltage line VDD5 and the external power supply voltage line VDD52 so that the area of this intersecting portion increases. In this intersecting portion, more vias V than those shown in FIG. 1G are formed in accordance with the increased area to couple the external power supply voltage line VDD5 and the external power supply voltage line VDD52. These vias V may be separately treated as a via group coupled to the second projecting portion 5D2 and the other via group coupled to the other intersecting portions, for convenience, but the via V straddling both regions may be further formed.

Note that, the second projecting portion 5D2 also includes a collar portion integrally formed into the external power supply voltage line VDD5, in addition to the above-described intersecting portion. This collar portion is formed in a region sandwiched between the external ground voltage line VSS51 and the external power supply voltage line VDD52 and also sandwiched between the external power supply voltage line VDD5 and the external ground voltage line VSS5.

Moreover, the external ground voltage line VSS5 shown in FIGS. 5A and 5B is equal to the external ground voltage line VSS42 shown in FIG. 1G having two projecting portions 5S1 and 5S2 integrally added thereto.

Here, the first projecting portion 5S1 is arranged at an intersecting portion between the external ground voltage line VSS5 and the external ground voltage line VSS51 so that the area of this intersecting portion increases. In this intersecting portion, more vias V than those shown in FIG. 1G are formed in accordance with the increased area to couple the external ground voltage line VSS5 and the external ground voltage line VSS51. These vias V may be separately treated as a via group coupled to the first projecting portion 5S1 and the other via group coupled to the other intersecting portions, for convenience, but the via V straddling both regions may be further formed.

Similarly, the second projecting portion 5S2 is arranged at an intersecting portion between the external ground voltage line VSS5 and the external ground voltage line VSS52 so that the area of this intersecting portion increases. In this intersecting portion, more vias V than those shown in FIG. 1G are formed in accordance with the increased area to couple the external ground voltage line VSS2 and the external ground voltage line VSS52. These vias V may be separately treated as a via group coupled to the second projecting portion 5S2 and the other via group coupled to the other intersecting portions, for convenience, but the via V straddling both regions may be further formed.

Note that, the first projecting portion 5S1 also includes a collar portion integrally formed into the external ground voltage line VSS5, in addition to the above-described intersecting portion. This collar portion is formed in a region sandwiched between the external ground voltage line VSS51 and the external power supply voltage line VDD52 and also sandwiched between the external power supply voltage line VDD5 and the external ground voltage line VSS5.

In the wiring portion 2 according to the first embodiment, from left to right in FIGS. 2A and 2B, the first projecting portions 2D1 and 2S1 and the second projecting portions 2D2 and 2S2 in each of the external power supply voltage line VDD2 and the external ground voltage line VSS2 are alternately arranged in this order. This is because in order to form as many vias V as possible in each projecting portion and also secure a wiring width as wide as possible even if partially, a shape as long as possible has been selected in the vertical direction in FIGS. 2A and 2B in a region between the external power supply voltage line VDD2 and the external ground voltage line VSS2.

The use of the wiring portion 2 according to the first embodiment shown in FIGS. 2A and 2B provides the following effect. That is, the power supply circuit of the semiconductor device is reinforced by increasing a total number of vias V transmitting the external power supply voltage Vdd and the external ground voltage Vss between the wiring layers and increasing the width of the power supply wiring. The embodiment is effective especially when a drop of a power supply voltage and/or power EM is restrained by a total number of vias V and the width of the power supply wiring and also when an influence by a total number of vias V is larger than an influence by the wiring width.

Fifth Embodiment

Figure 6A:
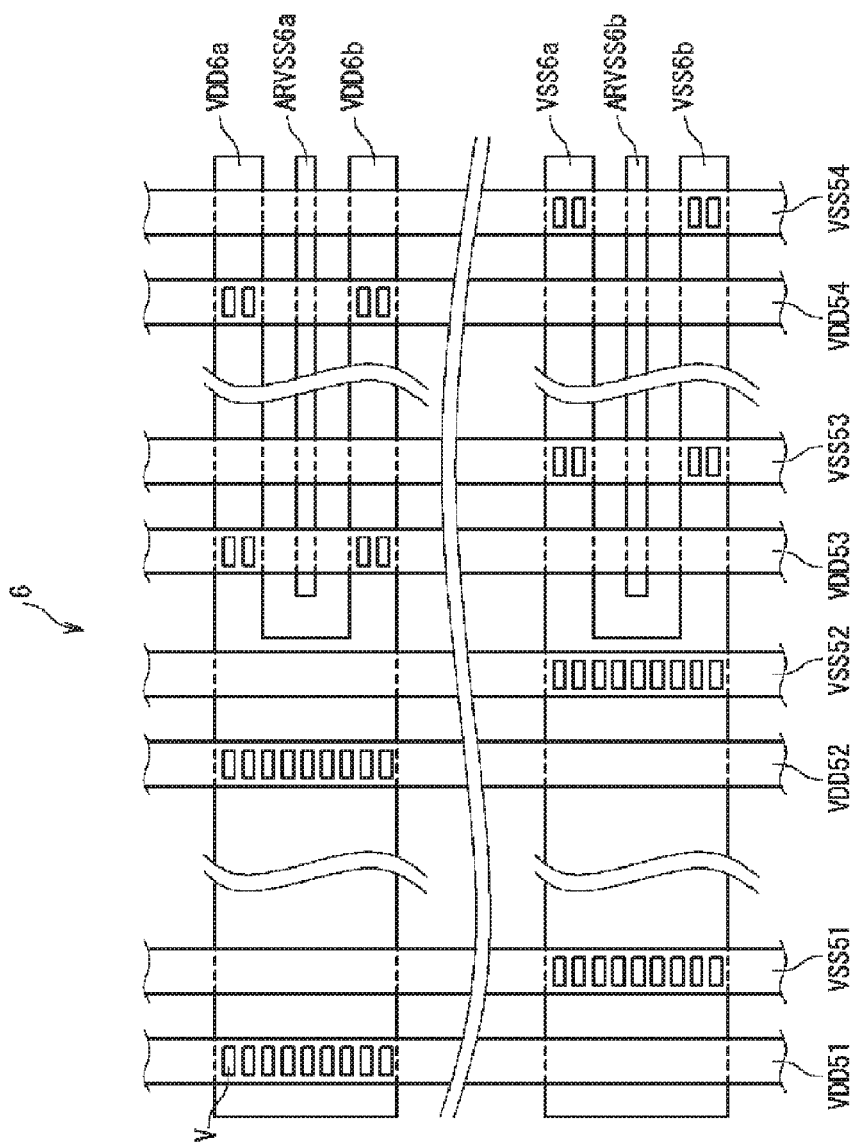
FIG. 6A is a plan view showing the configuration of a wiring portion 6 according to a fifth embodiment.

FIG. 6A is a plan view showing the configuration of a wiring portion 6 according to a fifth embodiment. The components of the wiring portion 6 shown in FIG. 6A are described. The wiring portion 6 shown in FIG. 6A includes the external power supply voltage lines VDD6a, VDD6b and VDD51 to VDD54, the external ground voltage lines VSS6a, VSS6b and VSS51 to VSS54, the local ground lines ARVSS6a and ARVSS6b, and the vias V.

Here, the external power supply voltage lines VDD51 to VDD54 and the external ground voltage lines VSS51 to VSS54 shown in FIG. 6A are assumed to be identical to the external power supply voltage lines VDD51 to VDD54 and the external ground voltage lines VSS51 to VSS54 shown in FIG. 1G, respectively. Moreover, the external power supply voltage lines VDD6a and VDD6b, the external ground voltage lines VSS6a and VSS6b, and the local ground lines ARVSS6a and ARVSS6b shown in FIG. 6A are assumed to correspond to the external power supply voltage line VDD42, the external ground voltage line VSS42, the external power supply voltage line VDD43, the external ground voltage line VSS43, the local ground line ARVSS42, and the local ground line ARVSS43 shown in FIG. 1G, respectively. In this manner, the wiring portion 6 shown in FIG. 6A is assumed to be used in substitution for the wiring portion 1b in the SRAM shown in FIG. 1G. Here, note that between the external ground voltage line VSS42 as well as the external power supply voltage line VDD43 shown in FIG. 1G and the external ground voltage line VSS6b as well as the external ground voltage line VSS6a shown in FIG. 6A, the roles thereof, i.e., the voltages to be applied, are exchanged.

Figure 6B:
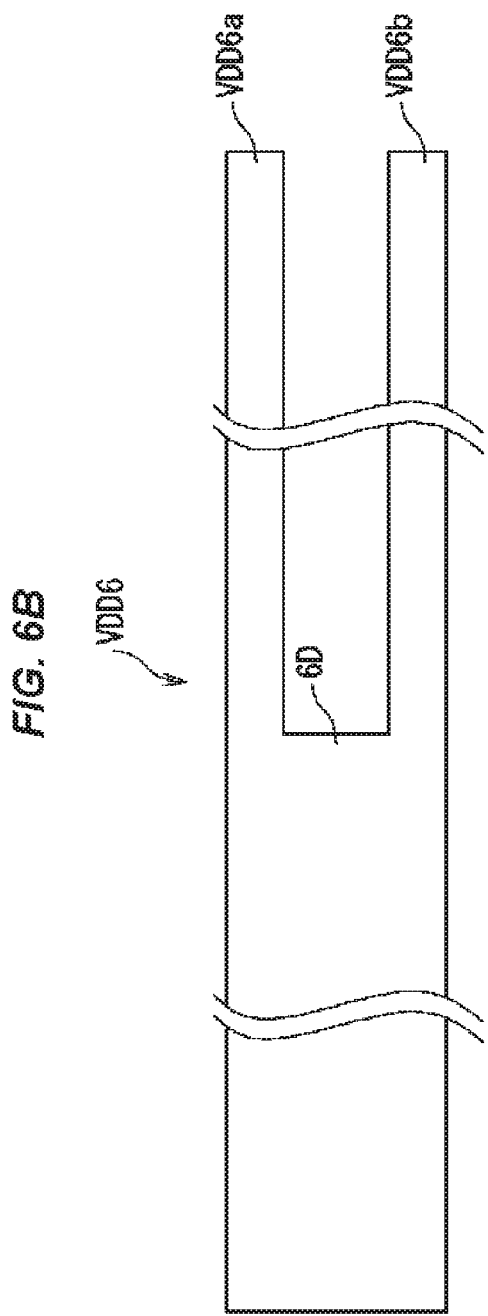
FIG. 6B is a plan view showing the configuration of external power supply voltage lines VDD6*a* and VDD6*b* according to the fifth embodiment.

FIG. 6B is a plan view showing the configuration of the external power supply voltage lines VDD6a and VDD6b according to the fifth embodiment. FIG. 6C is a plan view showing the configuration of the external ground voltage lines VSS6a and VSS6b according to the fifth embodiment. The external power supply voltage lines VDD6a and VDD6b shown in FIGS. 6A and 6B are equal to the external power supply voltage line VDD42 and the external ground voltage line VS542 shown in FIG. 1G having a projecting portion 6D integrally added thereto. As a result, the external power supply voltage lines VDD6a and VDD6b and the projecting portion 6D are integrated as a wiring, so hereinafter this is referred to as an external power supply voltage line VDD6.

The projecting portion 6D is formed in a region, between the external power supply voltage lines VDD6a and VDD6b, included in the output circuit Out. Accordingly, the projecting portion 6D includes a first intersecting portion intersecting with the external power supply voltage lines VDD51 and VDD52, a second intersecting portion intersecting with the external ground voltage lines VSS51 and VSS52, and the other portion.

In this first intersecting portion, the via V is formed to couple the external power supply voltage line VDD6 to the external power supply voltage lines VDD51 and VDD52. Here, these vias may be separately treated as a via group provided in an intersecting portion between the external power supply voltage line VDD6a and the external power supply voltage line VDD51, a via group provided in an intersecting portion between the external power supply voltage line VDD6b and the external power supply voltage line VDD51, and a via group provided in an intersecting portion between the projecting portion 6D and the external power supply voltage line VDD51, but the via V straddling a plurality of intersecting portions may be further formed. Similarly, these vias may be separately treated as a via group provided in an intersecting portion between the external power supply voltage line VDD6a and the external power supply voltage line VDD52, a via group provided in an intersecting portion between the external power supply voltage line VDD6b and the external power supply voltage line VDD52, and a via group provided in an intersecting portion between the projecting portion 6D and the external power supply voltage line VDD52, but the via V straddling a plurality of intersecting portions may be further formed.

Similarly, the external ground voltage lines VSS6a and VSS6b shown in FIGS. 6A and 6C are equal to the external power supply voltage line VDD43 and the external ground voltage line VSS43 shown in FIG. 1G having a projecting portion 6S integrally added thereto. As a result, the external ground voltage lines VSS6a and VSS6b and the projecting portion 6S are integrated as a wiring, so hereinafter this is referred to as an external ground voltage line VSS6.

The projecting portion 6S is formed in a region, between the external ground voltage lines VSS6a and VSS6b, included in the output circuit Out. Accordingly, the projecting portion 6S includes a first intersecting portion intersecting with the external power supply voltage lines VDD51 and VDD52, a second intersecting portion intersecting with the external ground voltage lines VSS51 and VSS52, and the other portion.

In this second intersecting portion, the via V is formed to couple the external ground voltage line VSS6 to the external ground voltage lines VSS51 and VSS52. Here, these vias may be separately treated as a via provided in an intersecting portion between the external ground voltage line VSS6a and the external ground voltage line VSS51, a via group provided in an intersecting portion between the external ground voltage line VSS6b and the external ground voltage line VSS51, and a via group provided in an intersecting portion between the projecting portion 6S and the external ground voltage line VSS51, but the via V straddling a plurality of intersecting portions may be further formed. Similarly, these vias may be separately treated as a via group provided in an intersecting portion between the external ground voltage line VSS6a and the external ground voltage line VSS52, a via group provided in an intersecting portion between the external ground voltage line VSS6b and the external ground voltage line VSS52, and a via group provided in an intersecting portion between the projecting portion 6S and the external ground voltage line VSS52, but the via V straddling a plurality of intersecting portions may be further formed.

The use of the wiring portion 6 according to the fifth embodiment shown in FIGS. 6A to 6C provides the following effects. That is, the power supply circuit of the semiconductor device is reinforced by providing the external power supply voltage line VDD6 and the external ground voltage line VSS6, the wiring width of each of which has been significantly increased, and increasing a total number of vias V transmitting the external power supply voltage Vdd and the external ground voltage Vss between the wiring layers. The embodiment is effective especially when a drop of a power supply voltage and/or power EM is restrained by a total number of vias V and also there is delamination larger than criteria.

Sixth Embodiment

Figure 7A:
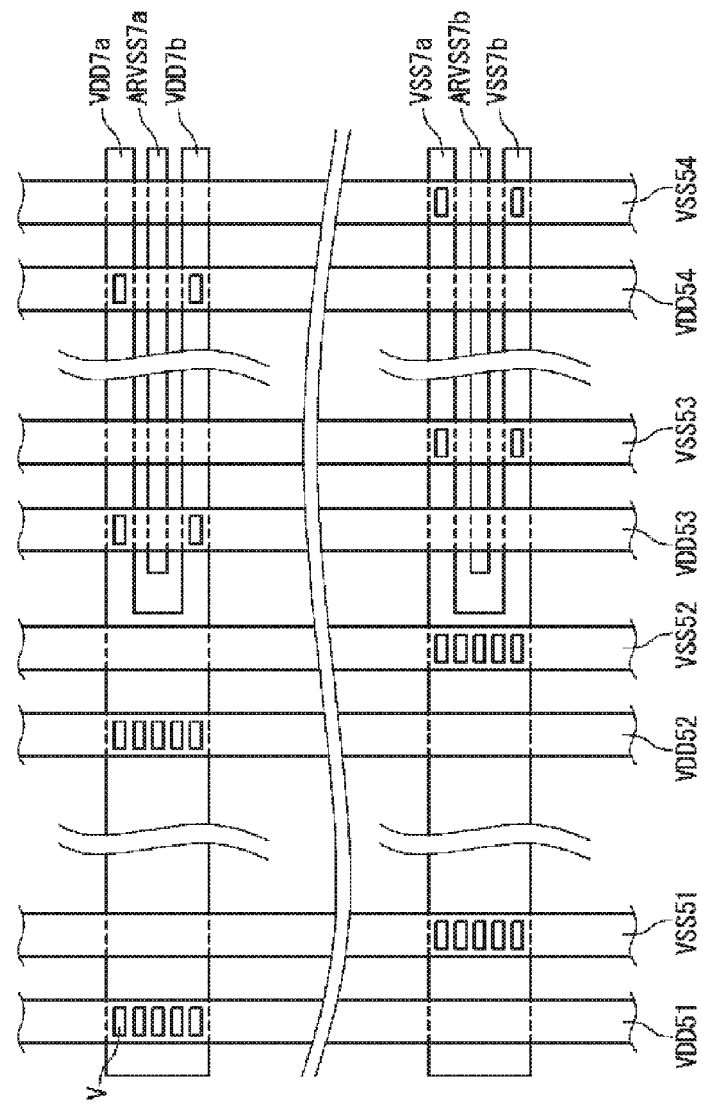
FIG. 7A is a plan view showing the configuration of a wiring portion 7 according to a sixth embodiment.

FIG. 7A is a plan view showing the configuration of a wiring portion 7 according to a sixth embodiment. The components of the wiring portion 7 shown in FIG. 7A are described. The wiring portion 7 shown in FIG. 7A includes external power supply voltage lines VDD7a, VDD7b and VDD51 to VDD54, external ground voltage lines VSS7a, VSS7b and VSS51 to VSS54, local ground lines ARVSS7a and ARVSS7b, and the vias V.

FIG. 7B is a plan view showing the configuration of the external power supply voltage lines VDD7a and VDD7b according to the sixth embodiment. FIG. 7C is a plan view showing the configuration of the external ground voltage lines VSS7a and VSS7b according to the sixth embodiment. The external power supply voltage lines VDD7a and VDD7b shown in FIGS. 7A and 7B are equal to the external power supply voltage line VDD42 and the external ground voltage line VS542 shown in FIG. 1G having a projecting portion 7D integrally added thereto. As a result, the external power supply voltage lines VDD7a and VDD7b and the projecting portion 7D are integrated as a wiring, so hereinafter this is referred to as an external power supply voltage line VDD7.

Similarly, the external ground voltage lines VSS7a and VSS7b shown in FIGS. 7A and 7C are equal to the external power supply voltage line VDD43 and the external ground voltage line VSS43 shown in FIG. 1G having a projecting portion 7S integrally added thereto. As a result, the external ground voltage lines VSS7a and VSS7b and the projecting portion 7S are integrated as a wiring, so hereinafter this is referred to as an external ground voltage line VSS7.

The wiring portion 7 according to the sixth embodiment shown in FIGS. 7A to 7C is equal to the wiring portion 6 according to the fifth embodiment shown in FIGS. 6A to 6C added by the following changes. That is, the wiring widths of the external power supply voltage lines VDD7a and VDD7b and the external ground voltage lines VSS7a and VSS7b according to the sixth embodiment are set narrower than those of the external power supply voltage lines VDD6a and VDD6b and the external ground voltage lines VSS6a and VSS6b according to the fifth embodiment. The other configuration of the wiring portion 7 according to the present embodiment is the same as in the case of the fifth embodiment, so further detailed description is omitted.

In the present embodiment, in addition to an effect similar to the effect obtained by the fifth embodiment, an effect that the interconnectivity improves further than in the case of the fifth embodiment is obtained.

Seventh Embodiment

FIG. 8A is a plan view showing the configuration of a wiring portion 8 according to a seventh embodiment. The components of the wiring portion 8 shown in FIG. 8A are described. The wiring portion 8 shown in FIG. 8A includes external power supply voltage lines VDD8a, VDD8b and VDD51 to VDD54, external ground voltage lines VSS8a, VSS8b and VSS51 to VSS54, and local ground lines ARVSS8a and ARVSS8b, and the vias V.

FIG. 8B is a plan view showing the configuration of the external power supply voltage lines VDD8a and VDD8b according to the seventh embodiment. FIG. 8C is a plan view showing the configuration of the external ground voltage lines VSS8a and VSS8b according to the seventh embodiment. The external power supply voltage lines VDD8a and VDD8b shown in FIGS. 8A and 8B are equal to the external power supply voltage line VDD42 and the external ground voltage line VS542 shown in FIG. 1G having a first projecting portion 8D1 and a second projecting portion 8D2 added thereto and integrated thereinto. As a result, the external power supply voltage lines VDD8a and VDD8b and the first and second projecting portions 8D1 and 8D2 are integrated as a wiring, so hereinafter this is referred to as an external power supply voltage line VDD8.

Similarly, the external ground voltage lines VSS8*a* and VSS8*b* shown in FIGS. 8A and 8C are equal to the external power supply voltage line VDD43 and the external ground voltage line VSS43 shown in FIG. 1G having a first projecting portion 8S1 and a second projecting portion 8S2 added thereto and integrated thereinto. As a result, the external ground voltage lines VSS8*a* and VSS8*b* and the projecting portion 8S are integrated as a wiring, so hereinafter this is referred to as an external ground voltage line VSS8.

The wiring portion 8 according to the seventh embodiment shown in FIGS. 8A to 8C is equal to the wiring portion 7 according to the sixth embodiment shown in FIGS. 7A to 7C added by the following changes. That is, from the projecting portion 7D of the external power supply voltage line VDD7 according to the seventh embodiment, portions other than the first or second intersecting portion intersecting with the external power supply voltage line VDD51 or VDD52 are removed. Similarly, from the projecting portion 7S of the external ground voltage line VSS7 according to the seventh embodiment, portions other than the first or second intersecting portion intersecting with the external ground voltage line VSS51 or VSS52 are removed.

In other words, the first projecting portion 8D1 of the external power supply voltage line VDD8 according to the seventh embodiment shown in FIG. 8B intersects with the external power supply voltage line VDD51, and is coupled thereto by the via V. Moreover, similarly, the second projecting portion 8D2 intersects with the external power supply voltage line VDD52, and is coupled thereto by the via V. Similarly, the first projecting portion 8S1 of the external ground voltage line VSS8 according to the seventh embodiment shown in FIG. 8C intersects with the external ground voltage line VSS51, and is coupled thereto by the via V. Moreover, similarly, the second projecting portion 8S2 intersects with the external ground voltage line VSS52, and is coupled thereto by the via V.

The other configuration of the wiring portion 8 according to the present embodiment is the same as in the case of the sixth embodiment, so further detailed description is omitted.

In the present embodiment, the wiring widths of the external power supply voltage lines VDD8*a* and VDD8*b* and the external ground voltage lines VSS8*a* and VSS8*b* are suppressed to be small. Accordingly, in the present embodiment, in addition to an effect similar to the effect obtained by the sixth embodiment, an effect that the interconnectivity further improves is obtained.

In the foregoing, the invention made by the present inventor has been specifically described based on the embodiments, but it is needless to say that the present invention is not limited to the above-described embodiments and various modifications are possible without departing from the scope and spirit of the present invention. Moreover, the respective embodiments described above can be arbitrarily combined without technically contradicting the contents of the embodiments.

What is claimed is:

1. A Static Random Access Memory (SRAM) device, comprising:
    at least one memory cell arranged in a first wiring layer;
    a first wiring arranged in a second wiring layer;
    a second wiring arranged in the second wiring layer;
    a third wiring arranged in the second wiring layer between the first and second wirings;
    a first projecting portion integrally formed with the first wiring between the first and second wirings in the second wiring layer;
    a fourth wiring arranged in a third wiring layer, the fourth wiring intersecting with the first wiring and the first projecting portion;
    a first via coupling between the first wiring and the fourth wiring; and
    a second via coupling between the first projecting portion and the fourth wiring,
    wherein the first via coupling is formed on a portion on the first wiring that is adjacent to the first projecting portion such the first via coupling and the second via coupling are adjacent to each other.

2. The SRAM device of claim 1,
    wherein the third wiring is connected to the at least one memory cell.

3. The SRAM device of claim 1,
    wherein the at least one memory cell includes:
    first and second storage nodes;
    first and second P channel transistors having drains coupled to the first and second storage nodes, respectively, gates coupled to the second and first storage nodes, respectively, and sources coupled to a cell power line;
    first and second N cannel transistors having sources coupled to the third wiring, drains coupled to the first and second storage nodes, respectively, gates coupled to the second and first storage nodes, respectively; and
    third and fourth N channel transistors having gates coupled to a word line, having source-drain paths coupled to the bit lines and the first and second storage nodes, respectively.

4. The SRAM device of claim 3, further comprising:
    a fifth N channel transistor having a source-drain path coupled to the third wiring and a ground voltage, and a gate coupled to a control signal.

5. The SRAM device of claim 4, further comprising:
    a sixth N channel transistor having a source-drain path coupled to the third wiring and the ground voltage, and a gate coupled to the drain thereof.

6. The SRAM device of claim 5,
    wherein the at least one memory cell is arranged between the fifth N channel transistor and the sixth N channel transistor.

7. The SRAM device of claim 5, further comprising:
    a cell power line voltage control circuit coupled to the cell power line and for controlling a voltage level of the cell power line so that
    1) a voltage level of the cell power line is below a power supply voltage in a write mode of the at least one memory cell, and
    2) a voltage level of the cell power line keeps the power supply voltage in a read mode and the standby mode of the at least one memory cell.

8. A Static Random Access Memory (SRAM) device, comprising:
    at least one memory cell arranged in a first wiring layer;
    a first wiring arranged in a second wiring layer;
    a second wiring arranged in the second wiring layer;
    a third wiring arranged in the second wiring layer between the first and second wirings;
    a first projecting portion integrally formed with the first wiring between the first and second wirings in the second wiring layer;
    a fourth wiring arranged in a third wiring layer, the fourth wiring intersecting with the first wiring and the first projecting portion;

a first via coupling between the first wiring and the fourth wiring; and a second via coupling between the first projecting portion and the fourth wiring, wherein the at least one memory cell includes:

first and second storage nodes;

first and second P channel transistors having drains coupled to the first and second storage nodes, respectively, gates coupled to the second and first storage nodes, respectively, and sources coupled to a cell power line;

first and second N cannel transistors having sources coupled to the third wiring, drains coupled to the first and second storage nodes, respectively, gates coupled to the second and first storage nodes, respectively; and third and fourth N channel transistors having gates coupled to a word line, having source-drain paths coupled to the bit lines and the first and second storage nodes, respectively.

9. The SRAM device of claim 8, wherein the third wiring is connected to the at least one memory cell.

10. The SRAM device of claim 8, further comprising:

a fifth N channel transistor having a source-drain path coupled to the third wiring and a ground voltage, and a gate coupled to a control signal.

11. The SRAM device of claim 10, further comprising:

a sixth N channel transistor having a source-drain path coupled to the third wiring and the ground voltage, and a gate coupled to the drain thereof.

12. The SRAM device of claim 11, wherein the at least one memory cell is arranged between the fifth N channel transistor and the sixth N channel transistor.

13. The SRAM device of claim 11, further comprising:

a cell power line voltage control circuit coupled to the cell power line and for controlling a voltage level of the cell power line so that 1) a voltage level of the cell power line is below a power supply voltage in a write mode of the at least one memory cell, and
2) a voltage level of the cell power line keeps the power supply voltage in a read mode and the standby mode of the at least one memory cell.

\* \* \* \* \*